(12) United States Patent
Hanawa et al.

(10) Patent No.: US 8,309,982 B2
(45) Date of Patent: Nov. 13, 2012

(54) GROUP-III NITRIDE SEMICONDUCTOR LIGHT-EMITTING DEVICE, METHOD FOR MANUFACTURING THE SAME, AND LAMP

(75) Inventors: Kenzo Hanawa, Ichihara (JP); Hiromitsu Sakai, Chiba (JP); Yasumasa Sasaki, Kamakura (JP)

(73) Assignee: Showa Denko K.K., Tokyo (JP)

( * ) Notice: Subject to any disclaimer, the term of this patent is extended or adjusted under 35 U.S.C. 154(b) by 53 days.

(21) Appl. No.: 12/999,726

(22) PCT Filed: Jun. 11, 2009

(86) PCT No.: PCT/JP2009/060677
§ 371 (c)(1),
(2), (4) Date: Dec. 17, 2010

(87) PCT Pub. No.: WO2009/154129
PCT Pub. Date: Dec. 23, 2009

(65) Prior Publication Data
US 2011/0095331 A1    Apr. 28, 2011

(30) Foreign Application Priority Data
Jun. 18, 2008 (JP) ................................. 2008-159690

(51) Int. Cl.
*H01L 33/32* (2010.01)
(52) U.S. Cl. .................. 257/99; 257/103; 257/E33.058; 257/E33.025; 257/E33.06; 438/46
(58) Field of Classification Search .................... 257/99, 257/103, E33.058, E33.025, E33.06; 438/46, 438/604
See application file for complete search history.

(56) References Cited

U.S. PATENT DOCUMENTS

| | | | |
|---|---|---|---|
| 6,713,789 B1 | 3/2004 | Shibata et al. | |
| 2006/0261353 A1* | 11/2006 | Bandoh | 257/79 |
| 2007/0066075 A1 | 3/2007 | Yuge | |

FOREIGN PATENT DOCUMENTS

| | | | |
|---|---|---|---|
| JP | 4-297023 A | | 10/1992 |
| JP | 3026087 B2 | | 3/2000 |
| JP | 2001-94150 A | | 4/2001 |
| JP | 2002-270894 A | | 9/2002 |
| JP | 2005-19964 A | | 1/2005 |
| JP | 2005-302940 A | | 10/2005 |
| JP | 2006-313771 A | | 11/2006 |
| JP | 2007-86295 A | | 4/2007 |
| JP | 2007220745 | * | 8/2007 |
| JP | 2008034444 | * | 2/2008 |

OTHER PUBLICATIONS

Translation of JP 2007-220745.*

(Continued)

*Primary Examiner* — Evan Pert
*Assistant Examiner* — Whitney T Moore
(74) *Attorney, Agent, or Firm* — Sughrue Mion, PLLC

(57) ABSTRACT

Provided is a group-III nitride semiconductor light-emitting device which has a high level of crystallinity and superior internal quantum efficiency and which is capable of enabling acquisition of high level light emission output, and a manufacturing method thereof, and a lamp. An AlN seed layer composed of a group-III nitride based compound is laminated on a substrate 11, and on this AlN seed layer, there are sequentially laminated each layer of an n-type semiconductor layer, a light-emitting layer, and a p-type semiconductor layer respectively composed of a group-III nitride semiconductor, wherein the full width at half-maximum of the X-ray rocking curve of the (0002) plane of the p-type semiconductor layer 16 is 60 arcsec or less, and the full width at half-maximum of the X-ray rocking curve of the (10-10) plane is 250 arcsec or less.

8 Claims, 3 Drawing Sheets

OTHER PUBLICATIONS

Translation of JP 2008-034444.*

E. Valcheva, T. Paskova, S. Tungasmita, P. O. Å. Persson, J. Birch, E. B. Svedberg, L. Hultman, and B. Monemar, Interface structure of hydride vapor phase epitaxial GaN grown with high-temperature reactively sputtered AlN buffer, Appl. Phys. Lett. 76, 1860 (2000); http://dx.doi.org/10.1063/1.126192 (3 pages).*

International Search Report mailed Jul. 21, 2009 for corresponding PCT/JP2009/060677.

* cited by examiner

US 8,309,982 B2

GROUP-III NITRIDE SEMICONDUCTOR LIGHT-EMITTING DEVICE, METHOD FOR MANUFACTURING THE SAME, AND LAMP

FIELD OF THE INVENTION

The present invention relates to a group-III nitride semiconductor light-emitting device suitably used for a light-emitting diode (LED), a laser diode (LD), an electronic device, and the like, a method for manufacturing the same, and a lamp which uses a group-III nitride based compound semiconductor light-emitting device.

Priority is claimed on Japanese Patent Application No. 2008-159690, filed Jun. 18, 2008, the contents of which are incorporated herein by reference.

BACKGROUND ART

A group-III nitride based compound semiconductor is a direct transition type semiconductor, which is used as a light-emitting device, for example, has a wide range light-emission spectrum covering ultraviolet to red, and it is applied to light-emitting devices such as a light-emitting diode (LED) and laser diode (LD). This type of light-emitting device has a higher light emission efficiency compared to a conventional illumination-related light source, and therefore a low level of energy consumption thereof can be achieved. Moreover, this type of light-emitting device also has an advantage of long life, and the market for blue-color LEDs in particular is rapidly expanding.

This type of group-III nitride semiconductor light-emitting device is manufactured generally by being film-formed on a substrate composed of, for example, sapphire ($Al_2O_3$) by means of a metal-organic chemical vapor deposition (MOCVD) method with raw materials including trimethyl gallium, triethyl aluminum, and ammonia. In the MOCVD method, vapors of the materials contained in a carrier gas are transported to the substrate surface, and the materials are decomposed on the heated substrate surface, to thereby grow crystals.

Conventionally, single crystal wafers of group-III nitride semiconductor have not been commercially available, and group-III nitride semiconductors are commonly obtained by growing crystals on a single crystal wafer of a different material. However, between such different types of substrates and group-III nitride semiconductor crystals epitaxially grown thereon, there is a considerable lattice misfit. For example, in a case where gallium nitride (GaN) is grown on a sapphire substrate, 16% lattice misfit is present between them. In general, if such a considerable lattice misfit is present as described above, it becomes difficult to epitaxially grow crystals directly on the substrate.

Consequently, there has been proposed and commonly practiced a method in which when epitaxially growing group-III nitride crystals on a sapphire single crystal substrate or on a SiC single crystal substrate by means of the MOCVD method, first, a layer called a low temperature buffer layer composed of aluminum nitride (AlN) or aluminum gallium nitride (AlGaN) is laminated on the substrate, and group-III nitride semiconductor crystals are epitaxially grown thereon at a high temperature (for example, refer to Patent Documents 1 and 2). According to the method disclosed in Patent Documents 1 and 2, by growing group-III nitride semiconductor crystals on a low temperature buffer layer formed on a substrate, it is possible to form single crystal GaN with superior crystallinity and obtain a light-emitting device having a high level of brightness.

On the other hand, although the type of technique disclosed in Patent Documents 1 and 2 which uses a low temperature buffer layer enables formation of signal crystal GaN, this type of GaN single crystals have higher defect density and the level of crystallinity thereof is lower compared to single crystals of other materials. However, in general, in a group-III nitride semiconductor light-emitting device composed of GaN, light emission output can be obtained at or above a certain level even in those cases where the level of crystallinity thereof is lower to a certain degree. Therefore, defect density has been conventionally considered as having almost no impact on light emission output as long as crystallinity is at or above a certain level. For example, it has been thought that in a light-emitting layer which is provided in a group-III nitride semiconductor light-emitting device and which has a multiple quantum well structure formed with GaN barrier layers and InGaN well layers, there is almost no correlation between photoluminescence (PL) and threading dislocation density, and light emission output is not dependent on threading dislocation density. For this reason, conventionally, as research of a technique for improving light emission efficiency of a group-III nitride semiconductor device, there has been mainly researched a technique for improving light extraction efficiency, rather than a technique for increasing crystallinity and improving internal quantum efficiency to thereby increase light emission intensity. Here, light extraction efficiency refers to a ratio of light which can be extracted to the outside of the light-emitting device to the light generated in the light-emitting layer.

In general, examples of an indicator of light emission efficiency of a light-emitting device include internal quantum efficiency described above as well as external quantum efficiency. Here, internal quantum efficiency is the proportion of electric current energy supplied to the device, which is converted into light in the light-emitting layer. Moreover, external quantum efficiency refers to a value obtained by multiplying the internal quantum efficiency by the light extraction efficiency, and may serve as an indicator of how effectively the generated light can be used. That is to say, a light-emitting device may be referred to as a light-emitting device of high light emission output if the external quantum efficiency level thereof is high. Furthermore, it is necessary to improve light extraction efficiency in order to improve external quantum efficiency.

Therefore, in recent years, as a method for improving light emission efficiency of a light-emitting device, there has been mainly researched a technique for increasing light extraction efficiency to thereby improve external quantum efficiency. Moreover, based on the conventional concept in which there is no clear correlation between crystallinity and internal quantum efficiency, it has been thought that improvement in light emission efficiency by improving internal quantum efficiency was nearing the limit.

Here, an indicator of the crystallinity of a group-III nitride semiconductor composed of GaN or the like may be obtained, for example, by conducting X-ray diffraction on p-GaN (p-type semiconductor layer) which serves to be the topmost layer and which forms an LED structure, to thereby find an FWHM (full width at half-maximum) of the X-ray rocking curve of the (0002) plane and (10-10) plane of the p-GaN.

For example, crystallinity of a buffer layer composed of AlN, GaN, or the like mentioned in Patent Documents 1 and 2 above, is of the order of approximately several thousands arcsec to several ten-thousands arcsec in terms of FWHM. Therefore, it has been conventionally thought that even in a case where the crystallinity of an upper layer improves as respective layers constituting the LED structure are further grown on this buffer layer, the limit of the FWHM of p-GaN of the topmost layer is approximately 100 arcsec for the (0002) plane and approximately 300 arcsec for the (10-10) plane.

Moreover, it has been thought that, for example, when GaN crystals with a (0002) plane of 100 arcsec and a (10-10) plane of 300 arcsec in terms of FWHM are compared with GaN crystals with a (0002) plane of 150 arcsec and a (10-10) plane of 380 arcsec, if both of them are provided with an LED structure, growth conditions for growing the LED structure have a greater impact on light emission efficiency than that of crystallinity, and there is almost no correlation with crystallinity.

After the invention of a low temperature buffer, crystallinity of GaN single crystals has improved considerably, and realization of p-type semiconductor GaN as well as realization of a double-heterostructure LED, which uses InGaN for its active layer, have improved the brightness of an LED of UV, blue, and green, consequently expanding a new market. However, while crystallinity has improved, the GaN crystallinity still has a defect density of approximately $10^{+9}/cm^2$, and this defect density is extremely high, compared to a GaAs based epitaxial single crystal thin film, which achieves approximately $1 \times 10^{+4}/cm^2$. Since light-emitting devices with 10% or more of external quantum efficiency have started to be made despite this, much research is now being conducted with a particular interest in finding out the reason why a GaN based LED can achieve a high level of light emission efficiency despite its high defect density.

One of the reasons why this type of research is being conducted is that improvement in crystallinity has reached its limit. In application for a laser diode, crystallinity needs to be further increased since there is a correlation between threshold current and crystallinity, and an epitaxial lateral overgrown method has been employed as a method for this. However, while this method partially improves crystallinity, it does not improve crystallinity of the entire wafer surface. Therefore, application of this method has not been preferred for an LED, in which cost is an important factor and the number of devices obtained from a single wafer is important, while the method may be applied to a laser diode. Consequently, the main interest in the area of increasing the brightness level of an LED has been brought to light extraction efficiency improvement, and there is a decreasing trend in the amount of research in the area of internal quantum efficiency improvement achieved by improving crystallinity.

Here, in a GaP based green LED, increased dislocation has been confirmed when conducting a TEM observation on a degraded chip during light emission (for example, refer to Non-Patent Document 1). Moreover, in a ZnSe based blue-green LED, it has been confirmed by TEM observation, and reported, that heretofore existing lamination defects grow and small dislocations are generated at a high level of density, creating non light-emitting centers (for example, refer to Non-Patent Document 2). In these cases of Non-Patent Documents 1 and 2, the above problem occurs even if the dislocation density is at a level of $10^{+4}/cm^2$. Here, unwanted energy hierarchy is established if a dislocation is present, and if excited electrons fall thereinto, light is no longer emitted at its original wavelength. Therefore, this type of state is referred to as a non light-emitting center. In a GaN based LED, light emission efficiency can be obtained at or above 10% even if the dislocation density is $10^{+10}/cm^2$, and the lifetime thereof can achieve a longer time compared to that of a GaAs based LED. Therefore, dislocations have not been considered as being the non light-emitting centers. In contrast, Sugahara et al. (for example, refer to Non-Patent Document 3) and Rosner et al. (for example, refer to Non-Patent Document 4) conducted a TEM observation on the same location where CL light emission took place to thereby prove that dislocations are the non light-emitting centers also in a GaN based LED.

Here, Mukai and Nakamura et al. reported in 1998 that in manufacturing a prototype of an LED which emits light at a peak wavelength in the vicinity of 370 nm, when active layers composed on InGaN slightly containing In and GaN used as an active layer are compared in a structure of p-GaN 1200 Å/p-AlGaN 600 Å/undoped InGaN 400 Å/n-AlGaN 300 Å/n-GaN 4 μm/GaN Buffer 300 Å, the level of light emission output is 10 times higher when using InGaN (for example, refer to Non-Patent Document 5). Therefore, the presence of InGaN is an essential condition for obtaining a high level of light emission efficiency, and as the reason therefor, localization of the energy state caused by fluctuations of the content of In in the InGaN quantum well layer is considered as being an essential activity. Furthermore, Mukai et al. (for example, refer to Non-Patent Document 6) manufactured a prototype of an LED of UV, blue, and green with the same structure, and investigated the electric current at a peak wavelength and temperature dependency. As a result, they have confirmed that if the peak wavelength is 375 nm or greater, it shifts to the shorter wavelength side when raising the electric current, and there is no variation in regards to temperature. In contrast, a GaInAlP based LED has an opposite effect in which its peak wavelength does not change even if the electric current is raised, but it shifts to the longer wavelength side if the temperature is raised, and therefore the light-emitting mechanism of these are considered completely different (for example, refer to Non-Patent Document 7).

Moreover, in 1996, Chichibu et al. manufactured a prototype of an LED using quantum wells in which x in undoped $In_xGa_{1-x}N$ is changed to x=0.2, 0.3, and 0.45, and they conducted energy structure analysis from an optical point of view in various types of methods in which: electric current was applied thereto to cause it to emit light, and the composition dependence thereof at the light emission peak was measured; and the composition dependence thereof was measured when homogeneous light with an altered wavelength was irradiated thereon to measure the electromotive force. Moreover, they discovered in the sectional TEM of the MQW that portions with darker colors were cyclically present in the well layer. Based on the above results, they summarized that a minimum potential was present due to the presence of fluctuation in the In concentration, and consequently holes locally existed in the minimum potential portion. As a result, light emission efficiency was increased (for example, refer to Non-Patent Document 8). After this, research has progressed systematically, and it is considered that the excitation life time becomes longer due to the local existence of an exciter in the quantum well layer, the diffusion distance of holes becomes shorter than the intervals of threading dislocation, and therefore the presence of threading dislocations, which are the non-radiative centers, does not have an influence on brightness (for example, refer to Non-Patent Document 9 to 14). Moreover, in 1998, Nakamura summarized the above research, organizing roles of crystal defects in GaN based LED and LD, and he concluded that improvement in crystallinity has no relation to light emission efficiency in an LED (for example, refer to Non-Patent Document 15).

Moreover, in 1997, Usui et al. proposed an epitaxially laterally overgrown method (for example, refer to Non-Patent Document 16), and further improvement in crystallinity became possible. In this method, having grown GaN by means of a MOCVD method with use of a low temperature buffer method, the surface is partially covered with $SiO_2$ by means of a photolithography technique. If GaN is grown by means of a HPVE method after this, GaN can no longer grow on the $SiO_2$, and therefore it grows laterally and is filled on the $SiO_2$. This type of GaN which has grown in a lateral direction has an extremely low level of threading dislocation, and therefore GaN single crystals with an extremely low level of threading dislocation can be formed only on the $SiO_2$ on a wafer.

Furthermore, in 1998, Mukai, Takegawa, and Nakamura reported results of manufacturing an LED in a structure of Mg doped p-GaN 2000 Å/Mg doped p-AlGaN 300 Å/undoped InGaN 25 Å/undoped GaN 2000 Å/Si doped n-GaN 2.3 μm/undoped GaN 1.5 μm/ as an ELOG substrate, and comparing it with an LED in which LT GaN buffer 300 Å is laminated on sapphire and the above structure is laminated thereon (for example, refer to Non-Patent Document 17). Here, the threading dislocation density could be reduced from $1\times10^{+10}/cm^2$ to $7\times10^{+6}/cm^2$. However, the light emission outputs are respectively 20 mA at 6 mW and were substantially equal while the peak wavelengths were slightly different at 470 nm and 464 nm. However, while the leakage current at low voltage 1.8V was 0.001 μA or lower with an ELOG product, which has a high level of dislocation density, it was 0.01 μA or greater with an m-sapphire product.

Moreover, in 1999, Chichibu et al. reported that they grew an SQW of InGaN on a substrate which used ELOG, and measured time integration and time-resolved PL at a portion with high dislocation density and at a portion with low dislocation density (for example, refer to Non-Patent Document 18). As a result of this, it was confirmed that optical characteristics do not change even if changes occur in threading dislocation density. Here, there was a discussion which questions whether penetrating dislocation is not the non light-emitting center. However, Sugahara et al. confirmed and reported that a dislocation is the non light-emitting center even in a GaN based LED, by observing the same location using TEM and CL (for example, refer to Non-Patent Document 30).

Moreover, in 1999, Mukai and Nakamura manufactured an LED structure of UV, blue, and green on both of a GaN which uses ELOG and on a general sapphire, and compared light emission efficiency (for example, refer to Non-Patent Document 19). As a result, in the case of using GaN as an active layer, the level of light emission efficiency was higher when the level of crystallinity was higher with use of ELOG. However, in the case of using InGaN as an active layer, the level of light emission efficiency did not change even with ELOG or with an LED grown on sapphire. However, in the case of UV, the level of light emission efficiency was higher with ELOG when the electric current density was raised. As the reason for this result, local existence of an exciter caused by fluctuations in the In concentration described above was given.

Furthermore, in 2006, there was a report of summarizing the above discussion which described that this is because InN locally captures a hole and the distance of the hole moving until the moment of light emission is extremely short, and therefore, light is emitted before the hole falls into the defect (for example, refer to Non-Patent Document 20). Therefore, as a direction of development in increasing the level of brightness of an LED, it was proposed that artificially creating inhomogeneity in a quantum well was preferred. This report was made by both Nakamura and Akasaki, who had led the development and academic research in the area of GaN based LED and LD, and it may be understood that this is the terminal point of current achievement in the area.

Moreover, there was invented a method for manufacturing GaN single crystal crystals such that when forming a GaN single crystal film on a sapphire substrate, approximately 300 Å of AlN or GaN is film-formed at a low temperature between 500 and 800° C., an island-shaped crystal is formed by raising the temperature thereafter, and the lateral direction growth of this island-shaped crystal is used. And this method became widely prevailed.

This layer, which was grown at a temperature lower than the growing temperature, is called a buffer layer. This layer is polycrystalline or amorphous, and only a part thereof becomes crystallized at a high temperature growth and does not entirely become crystallized. By partially crystallizing a considerable number of locations in this way, there is exerted a mechanism in which only crystals with a matched crystal orientation unite with each other in the lateral direction, thereby bonding crystals of sapphire and GaN. GaN single crystal growth has become possible with this type of low temperature buffer layer technology, and the market of high-brightness blue LEDs has rapidly expanded.

Although GaN single crystal growth has become possible with the low temperature buffering technique, the level of defect density in the high-brightness blue LED is extremely high as a crystal, compared to other single crystals such as GaAs. A widely accepted theory is that defect density and light emission efficiency has no correlation therebetween as long as there is a certain level of crystallinity, since an LED of high level output can be manufactured even if the level of defect density in GaN crystals is comparatively high, and a considerable number of published documents have discussed this (for example, refer to Non-Patent Documents 15 and 20). The assertion of these respective documents can be summarized as follows.

It became possible to control the threading dislocation density by lateral epitaxial coating growth, and create portions each having different levels of dislocation density. Consequently, it became possible to evaluate its relationship with brightness.

As a result, having investigated the relationship between photoluminescence (PL) and penetrating dislocation density in an InGaN quantum well, it has been revealed that light emission intensity is not dependent on penetrating dislocation density. Although penetrating dislocation serves as a non light-emitting recombination channel of surrounding carriers present within a diffusion length, it only reduces the volume of a light-emitting region. This is because, a minimal potential is generated in an InGaN multiple quantum well due to the fluctuations in the In concentration, and a hole is captured therein. As a result, light is emitted before the hole moves to the dislocation, which is a non light-emitting center.

Therefore, the development of improving light emission efficiency of a GaN based LED is being oriented towards improving light extraction efficiency, and research and development for increasing light emission efficiency by reducing defect density has been hardly conducted for a long time. Lateral epitaxial coating growth has been employed mainly in LDs. However, in 2001, Okagawa et al. had success in lateral growth by conducting a concave-convex treatment on a sapphire substrate, and they applied this to an LED (for example, refer to Non-Patent Document 21). Here, by reducing the dislocation density from $4\times10^{+8}/cm^2$ to $1.5\times10^{+8}/cm^2$, output improved from 3.5 mW to 9 mW with UV at a peak wavelength 382 nm. However, later, the output improvement of Non-Patent Document 21 was interpreted as being the increase in the light extraction efficiency due to the unevenness treatment if the sapphire surface. Accordingly, it is thought that such a technical recognition that the level of brightness can be increased by improving the level of crystallinity, is completely disappeared in the area of LEDs in recent years.

However, it is clear that if light emission efficiency can be further improved, applications in the area of LEDs will dramatically expand, and consequently, there has been an increasing demand for improvement in light emission efficiency. Light emission efficiency of an LED can be generally separated into two concepts, namely internal quantum efficiency and external quantum efficiency. Internal quantum efficiency is an indicator of how much of applied electric current has become light, and external quantum efficiency is an indicator of how effectively generated light can be used. Although it can be conceptually separated in this way, in reality, there is a loss such that the light which is once generated is absorbed into an energy gap of GaInN. Further, there is a problem as for this type of light loss in which it is fundamentally difficult to determine whether it has once become light or not. If the theory, in which light emission efficiency will not change even if crystallinity is improved, is accepted, it means that internal quantum efficiency has reached the limit. Therefore, in reality, the majority of recent research and development for improving light emission efficiency is aiming to increase light extraction efficiency to thereby improve external quantum efficiency.

[Prior Art Documents]
[Patent Documents]

[Patent Document 1] Japanese Patent No. 3026087
[Patent Document 2] Japanese Unexamined Patent Application, First Publication No. H04-297023

[Non-Patent Documents]

[Non-Patent Document 1] P. M. Petroff, O. G. Lorimor, J. M. Raiston, "Defect structure induced during forward-bias degradation of GaP green-light-emitting diodes", J. Appl. Phys. Vol. 47 (1976) 1583

[Non-Patent Document 2] S. Guha, J. M. DePuydt, M. A. Haase, J. Qiu, H. Cheng "Degradation of II-VI based blue-green light emitters", Appl. Phys. Lett. 63 (1993) 3107

[Non-Patent Document 3] T. Sugahara, H. Sat, M. Hao, Y. Naoi, S. Kurai, S. Tottori, K. Yamashita, K. Nishino, L. T. Romano, S. Sakai "Direct Evidence that Dislocations are Non-Radiative Recombination Centers in GaN", Jpn. J. Appl. Phys. Vol. 37 (1998) L398

[Non-Patent Document 4] S. J. Rosner, E. c. Carr, M. J. Ludowixe, G. Girolami, H. I. Erikson "Correlation of cathodoluminescence inhomogeneity with microstructural defects in epitaxial GaN grown by metalorganic Chemical-vapor deposition", Appl. Phys. Lett. 70 (1997) 420

[Non-Patent Document 5] T. Mukai, D. Morita, S. Nakamura, "High-Power UV InGaN/AlGaN double-heterostructure LEDs", J. Crystal Growth Vol. 189/190 (1998) p778

[Non-Patent Document 6] S. Nakamura, M. Senoh, N. Iwasa, S. Nagahawa, "Superbright Green InGaN Single-Quantum-Well-Structure Light Emitting Diodes", Jpn. J. Appl. Phys. Vol. 34 (1995) pL1332

[Non-Patent Document 7] T. Mukai, M. Yamada, S. Nakamura, "Current and Temperature Dependence of Electroluminnescence of InGaN-Based UV/Blue/Green Light-Emitting Diodes", Jpn. J. Appl. Phys. Vol. 37 (1998) L1358

[Non-Patent Document 8] S. Chichibu, T. Azuhata, T. Sota, S. Nakamura, "Spontaneous emission of localized excitons in InGaN single and multiquantum well structures", Appl. Phys. Lett. Vol. 69 (1996) 4188

[Non-Patent Document 9] S. Chichibu, A. Shikanai, T. Azuhata, T. Sota, A. Kuramata, K. Horino, S. Nakamura, "Effects of biaxial strain on exciton resonance energies of hexagonal GaN heteroepitaxial layers", Appl. Phys. Lett. Vol. 68 (1996) 3766

[Non-Patent Document 10] S. Chichibu, T. Azuhata, T. Sota, S. Nakamura, "Excitonic emissions from hexagonal GaN epitaxial layers", J. Appl. Phys. Vol. 79 (1996) p2784

[Non-Patent Document 11] S. Chichibu, Wada, S. Nakamura, "Spatially resolved cathodoluminescence spectra of InGaN quantum wells", Appl. Phys. Lett. Vol. 71 (1997) p2346

[Non-Patent Document 12] Y. Narukawa, Y. Kawakami, S. Fujita, S. Fujita, S. Nakamura, "Recombination dynamics of localized excitons in In0.20Ga0.80N—In0.05Ga0.95N multiple quantum wells", Phys. Rev. B Vol. 55 (1997) R1938

[Non-Patent Document 13] Y. Narukawa, Y. Kawakami, M. Funato, S. Fujita, S. Fujita, S. Nakamura, "Role of self-formed InGaN quantum dots for exciton localization in the purple laser diode emitting at 420 nm", Appl. Phys. Lett. Vol. 70 (1997) 981

[Non-Patent Document 14] S. Chichibu, T. Sota, K. Wada, S. Nakamura, "Exciton localization on InGaN quantum well devices", J. Vac. Sci. Technol. B Vol. 16 (1998) p2204

[Non-Patent Document 15] S. Nakamaura, "The Roles of Structural Imperfections in InGaN-Based BlueLight-Emitting Diodes and Laser Diodes", Science 14 Aug. 1998 vol. 281 No. 5379 pp 956-951

[Non-Patent Document 16] A. Usui, H. Sunakawa, A. Sakai, A. Yamaguchi, "Thick GaN Epitaxial Growth with Low Dislocation Density by Hydride Vapor Phase Epitaxy", Jpn. J. Appl. Phys. Vol. 36 (1997) L899

[Non-Patent Document 17] T. Mukai, K. Takekawa, S. Nakamura, "InGaN-Based Blue Light-Emitting Diodes Grown on Epitaxially Laterally Overgrown GaN Substrates", Jpn. J. Appl. Phys. Vol. 37 (1998) L839

[Non-Patent Document 18] S. F. Chichibu, H. Marchand, M. S. Minsky, S. Keller, P. T. Fini, J. P. Ibbetson, S. B. Fleischer, J. S. Speck, J. E. Bowers, E. Hu, U. K. Mishra, S. P. DenBaars, T. Deguchi, T. Sota, S. Nakamura, Appl. Phys. Lett. Vol. 74 (1999) 1460 "Emission mechanisms of bulk GaN and InGaN quantum wells prepared by lateral epitaxial overgrowth"

[Non-Patent Document 19] T. Mukai, S. Nakamura, Jpn. J. Appl. Phys. Vol. 38 (1999) 5735 "Ultraviolet InGaN and GaN Single-Quantum-Well-Structure Light-Emitting Diodes Grown on Epitaxially Laterally Overgrown GaN Substrates"

[Non-Patent Document 20] CHICHIBU Shigefusa F., UEDONO Akira, ONUMA Takeyoshi, KOYAMA Takahiro (Univ. Tsukuba, Tsukuba, JPN), HASKELL Benjamin A., FINI Paul T., DENBAARS Steven P., SPECK James S., NAKAMURA Shuji (JST-ERATO, Kawaguchi, JPN), UEDONO Akira (National Inst. Materials Sci., Tsukuba, JPN), CHAKRABORTY Arpan, KELLER Stacia, MISHRA Umesh K., (Univ. California, California, USA), YAMAGUCHI Shigeo, KAMIYAMA Satoshi, AMANO Hiroshi, AKASAKI Isamu (Meijo Univ., Nagoya, JPN), HAN Jung (Yale Univ., Connecticut, USA), SOTA Takayuki (Waseda Univ., Shinjuku, JPN) "Origin of defect-insensitive emission probability in In-containing (Al, In, Ga) N alloy semiconductors", Nature Materials Vol. 5, No. 10, Page 810-816 (2006.10)

[Non-Patent Document 21] OKAGAWA Hiroaki, OUCHI Yoichiro, TSUNEKAWA Takashi, TADATOMO Kazuyuki, KATO Munehiro "Developing high level output UV LED, using LEPS method", Mitsubishi Densen Kogyo Jiho (Mitsubishi Cable Industries, Inc. Times) No. 98 (2001), 92.

SUMMARY OF THE INVENTION

Problems to be Solved by the Invention

However, in a group-III nitride semiconductor light-emitting device such as an LED, electric current flows through crystals having an energy gap existing therein, and consequently there is generated light which has energy corresponding to the gap. Therefore, light emission efficiency thereof is reduced if electric current flows through a portion other than the energy gap. For this reason, there is a problem in that in a case where a defect is present in the crystals, in particular, where the defect is occurring and passing therethrough in the direction of the electric current flow, the electric current flows through the crystal defect as the applied voltage is raised, and consequently the light emission efficiency is reduced. Therefore, there is clearly a certain correlation between the crystallinity and light emission efficiency of a group-III nitride semiconductor light-emitting device.

Moreover, since there is a possibility of a dramatic expansion in application of light-emitting devices with further increase in light emission intensity, in recent years, in the area of group-III nitride semiconductor light-emitting devices such as LEDs, there has been a strong demand for improving not only light extraction efficiency but also internal quantum efficiency to thereby further increase light emission intensity. Therefore, there has been a strong demand not only for a method for improving light extraction efficiency but also for improving internal quantum efficiency of a group-III nitride semiconductor light-emitting device, to thereby increase light emission intensity and improve light emission output.

The present invention takes into consideration the above circumstances, with an object of providing a group-III nitride semiconductor light-emitting device with a high level of crystallinity and superior internal quantum efficiency, capable of enabling acquisition of a high level of light emission output.

Moreover, an object of the present invention is also to provide a method for manufacturing a group-III nitride semiconductor light-emitting device with a high level of light emission output, capable of forming a group-III nitride semiconductor with a high level of crystallinity.

Furthermore, an object of the present invention is also to provide a lamp which uses the above group-III nitride semiconductor light-emitting device.

Means for Solving the Problem

The present inventors earnestly conducted investigations in order to solve the above problems, and discovered first that by forming an AlN seed layer composed of a group-III nitride based compound such as single crystal AlN, the crystallinity of which is increased to an extremely high level, on a substrate made of sapphire, the crystallinity of a group-III nitride semiconductor such as GaN formed thereon is considerably improved. Then, the relationship between crystallinity and light emission intensity was investigated in detail, using a wafer having a film of this type of GaN crystal with a high level of crystallinity formed thereon. As a result, the inventors discovered that in a case of growing an LED structure on GaN crystals with a high level of crystallinity, by optimizing the LED structure and film formation conditions according to the crystallinity of the GaN crystals of the lower layer, it is possible to considerably improve light emission intensity.

Here, in general, a single crystal is a crystal with no crystal grain boundary present therein, and it refers to a crystal which has the same crystal orientation in all of the portions thereof. However, unless it is a perfect crystal, some kind of defect is present in any crystal, and crystal orientation subtly changes within the crystal, depending on the arrangement of this defect. Therefore, it is difficult to make a distinction between a single crystal and a polycrystal based on the state of inner defects. This is summarized below with an example of a thin film of a C-plane. First, in a case of conducting $2\theta$ analysis, there is a necessary condition such that a diffraction peak is observed only from the C-plane, and there is no peak from other planes. However, the single crystal mentioned in the present invention is a narrower concept. For crystallinity, the width of the diffraction peak of the (0002) plane is an issue, and if the diffraction peak is a sufficiently sharp peak, it means that planes with no defect are arranged in a line in a state where plane intervals are constant. Here, it is a question whether the crystallinity of the semiconductor crystal is sufficient when the sharpness of the semiconductor crystal is at a level similar to that of incident X-rays, it is definitely not sufficient. The sharpness of the X-ray rocking curve, that is, the full width at half-maximum (FWMH) of the X-ray rocking curve serves as a measure of determining whether it is oriented in the same direction at any location within a plane. If the value of this FWMH is high, it means that the C-plane is subtly oriented in various directions. As a result, there is a possibility that crystals may grow in irregular directions, and it becomes impossible to form a flat and smooth plane. Moreover, in the (10-10) plane, the full width at half-maximum of the peak of the X-ray rocking curve serves as an indicator which indicates an approximate degree of presence of partially rotated locations when seen from the direction perpendicular to the substrate surface. If this value is degraded, a defect penetrating through the C-axis direction starts to occur. That is to say, the single crystal mentioned in the present invention is a crystal in which the value of the full width at half-maximum of the X-ray rocking curve is regulated at or below a certain level, so that the single crystal of the present application imply that no columnar crystals are not observed at all, which appear in a low temperature buffer.

Moreover, in order to indicate the level of crystallinity of a group-III nitride semiconductor, crystallinity needs to be quantified and defined. Here, in the present invention, an indicator of the crystallinity of a group-III nitride semiconductor is obtained by conducting X-ray diffraction on a p-type semiconductor layer which serves to be the topmost layer and which forms an LED structure, to thereby find a FWHM (full width at half-maximum) of the X-ray rocking curve of the (0002) plane and (10-10) plane of the p-type semiconductor layer.

Based on the above knowledge, the present inventors discovered that by optimizing the LED structure and film formation conditions according to the crystallinity of the GaN crystals of the lower layer, it is possible to obtain a group-III nitride semiconductor light-emitting device which has a high level of crystallinity and superior internal quantum efficiency, and which can enable acquisition of high level light emission output, and thus completed the present invention. That is to say, the present invention relates to the aspects described below.

[1] A group-III nitride semiconductor light-emitting device configured in a way such that an AlN seed layer composed of a group-III nitride based compound is laminated on a substrate, and on this AlN seed layer, there are sequentially laminated each layer of an n-type semiconductor layer, a light-emitting layer, and a p-type semiconductor layer respectively composed of a group-III nitride semiconductor, wherein the full width at half-maximum of the X-ray rocking curve on the (0002) plane of the p-type semiconductor layer is 60 arcsec or less, and the full width at half-maximum of the X-ray rocking curve on the (10-10) plane is 250 arcsec or less.

[2] A group-III nitride semiconductor light-emitting device according to [1] above, wherein the light-emitting layer is configured in a way such that a barrier layer and well layer are alternately and repeatedly laminated, and are laminated in such an order that the barrier layer is to be arranged on the n-type semiconductor layer side and on the p-type semiconductor layer side, and the single-layer thickness of the barrier layer is within a range of 6 to 9 nm.

[3] A group-III nitride semiconductor light-emitting device according to [2] above, wherein the light-emitting layer is further configured in a way such that the total thickness of a single layer of the barrier layer and a single layer of the well layer adjacent to this single layer of barrier layer is within a range of 8 to 12 nm.

[4] A group-III nitride semiconductor light-emitting device according to any one of [1] to [3] above, wherein the AlN seed layer is composed of AlN single crystals.

[5] A group-III nitride semiconductor light-emitting device according to any one of [1] to [4] above, wherein the full width at half-maximum of the X-ray rocking curve in the (0002) plane of the AlN seed layer is 100 arcsec or less, and the full width at half-maximum of the X-ray rocking curve in the (10-10) plane is 1.7° or less.

[6] A method for manufacturing a group-III nitride semiconductor light-emitting device according to any one of [1] to [5], wherein the p-type semiconductor layer is formed by means of a metal-organic chemical vapor deposition method (MOCVD method), and within a chamber of a film forming apparatus, the distance between a wafer with a layer composed of a group-III nitride semiconductor formed on the substrate, and a shield provided parallel with this wafer's surface composed of the group-III nitride semiconductor, is 30 mm or less.

[7] A group-III nitride semiconductor light-emitting device which can be obtained, using the manufacturing method according to [6] above.

[8] A lamp formed with use of the group-III nitride semiconductor light-emitting device according to any one of [1] to [5] or [7] above.

Effect of the Invention

According to the group-III nitride semiconductor light-emitting device of the present invention, there is provided a configuration such that an AlN seed layer composed of a group-III nitride based compound is laminated on a substrate, and on this AlN seed layer, there are sequentially laminated each layer of an n-type semiconductor layer, a light-emitting layer, and a p-type semiconductor layer respectively composed of a group-III nitride semiconductor, in which the full width at half-maximum of the rocking curve in the (0002) plane of the p-type semiconductor layer is 60 arcsec or less, and the full width at half-maximum of the rocking curve in the (10-10) plane is 250 arcsec or less. As a result, each of the layers composed of the group-III nitride semiconductor is a layer having superior crystallinity, the internal quantum efficiency is improved, and it is consequently possible to obtain high level light emission output.

Furthermore, the lamp of the present invention is configured with use of the group-III nitride semiconductor light-emitting device of the present invention, and it is therefore provided with a superior light emission characteristic.

BEST MODE FOR CARRYING OUT THE INVENTION

Hereunder, there is described, with appropriate reference to the accompanying drawings, an embodiment of a group-III nitride semiconductor light-emitting device, a manufacturing method therefor, and a lamp according to the present invention.

[Group-III Nitride Semiconductor Light-Emitting Device]

Figure 1:
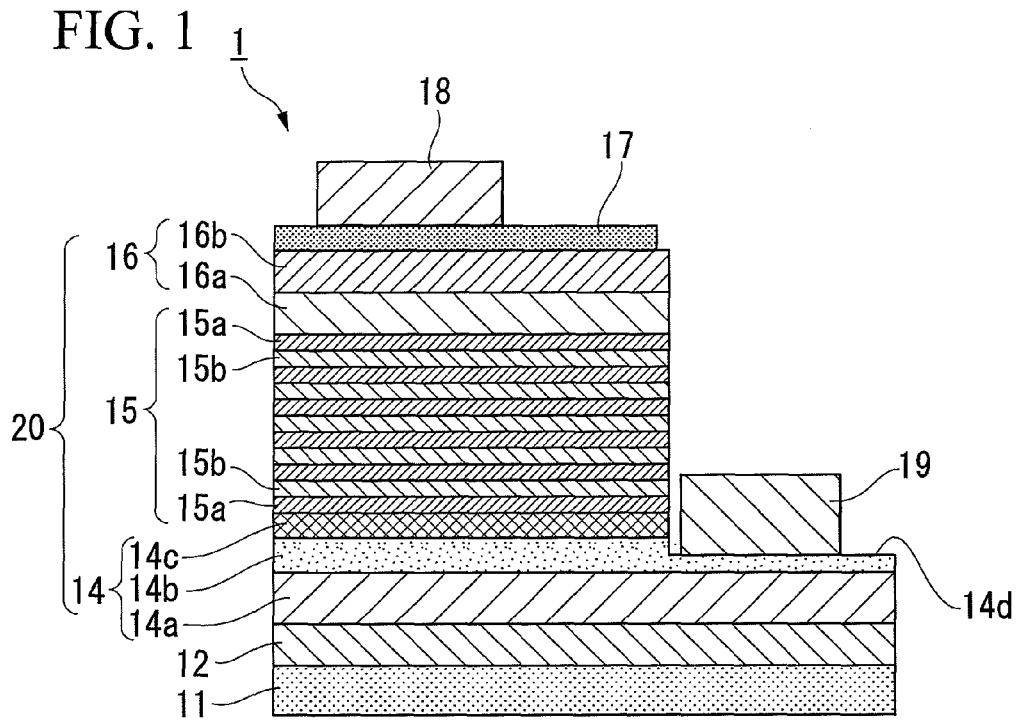
FIG. 1 is a schematic cross-sectional view for schematically describing an example of a group-III nitride semiconductor light-emitting device according to the present invention.
Figure 2:
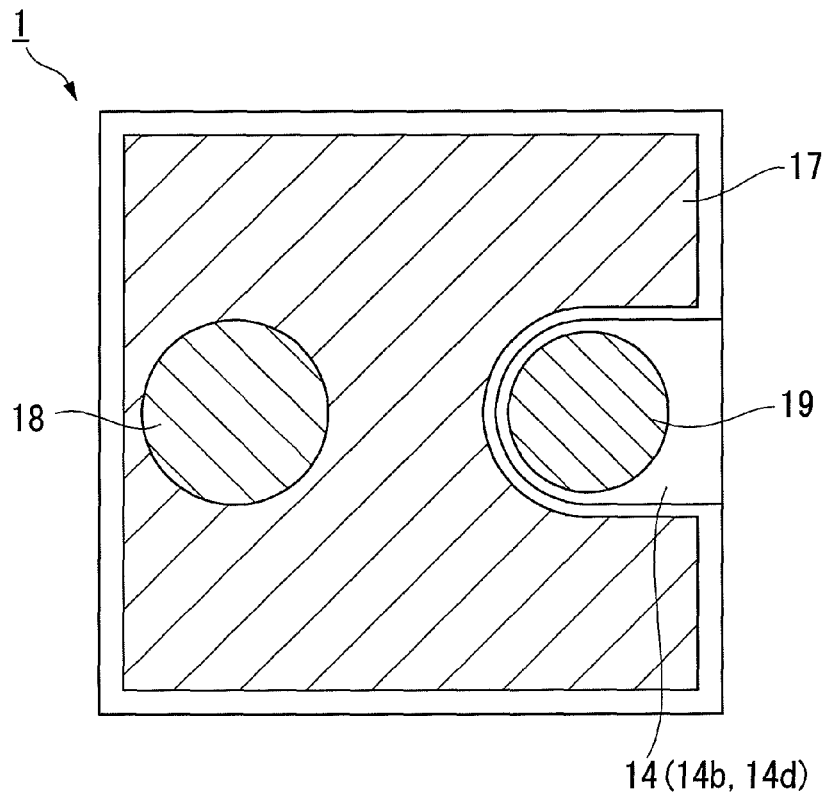
FIG. 2 is a diagram for schematically describing an example of the group-III nitride semiconductor light-emitting device according to the present invention, and is a schematic plan view of the light-emitting device shown in FIG. 1.

FIG. 1 is a schematic cross-sectional view schematically showing an example of a group-III nitride semiconductor light-emitting device according to the present invention (hereunder, this may be abbreviated as "light-emitting device"). Moreover, FIG. 2 is a schematic diagram showing a planar structure of the group-III nitride semiconductor light-emitting device shown in FIG. 1. A light-emitting device 1 described in the present embodiment, as shown in FIG. 1, is of a one-side electrode type, and is configured such that on a substrate 11, there are formed an AlN seed layer 12 composed of a group-III nitride based compound, and an LED structure 20 formed with a group-III nitride semiconductor. The LED structure 20, as shown in FIG. 1, is configured such that an n-type semiconductor layer 14, a light-emitting layer 15, and a p-type semiconductor layer 16 are respectively laminated in this order. Moreover, the light-emitting device 1 according to the present invention is such that the full width at half-maximum of the X rocking curve of the (0002) plane of the p-type semiconductor layer 16 is 60 arcsec or less, and the full width at half-maximum of the X-ray rocking curve of the (10-10) plane is 250 arcsec or less.

The semiconductor 1 of the present embodiment is configured such that, as shown with the example illustrated in FIG. 1 and FIG. 2, a translucent positive electrode 17 is laminated on the p-type semiconductor layer 16, a positive electrode bonding pad 18 is formed thereon, and a negative electrode 19 is laminated on an exposed region 14d formed on an n-type contact layer 14b of the n-type semiconductor layer 14.

Hereunder, there is described in detail the group-III nitride semiconductor light-emitting device of the present embodiment.

<Substrate and AlN Seed Layer>

Since it is extremely difficult to grow large bulk single crystals with GaN, AlN, InGaN, and AlGaN, which are group-III nitride semiconductors, there has been conventionally conducted heteroepitaxial growth with use of sapphire as a substrate. However, 11 to 23% lattice misfit and thermal expansion coefficient difference of $2\times10^{-6}$ [$deg^{-1}$] or less are present between sapphire and the above group-III nitride semiconductors. Moreover, since the chemical characteristics of both are different, a group-III nitride semiconductor epitaxial film directly grown on the sapphire only partially inherits the substrate's characteristic as a single crystal, and it three-dimensionally grows. As a result, it has been considered difficult to maintain the surface shape flat.

As the characteristics required for a substrate in order to grow a single crystal film of GaN, heat resistance up to 1,200° C. and non-responsiveness to $NH_3$ at this range of temperature are required. Sapphire and SiC are the only materials for a substrate which can be manufactured at feasible cost in terms of industrial production. Among these two materials, sapphire is predominantly advantageous when comparing the cost, and 90% or more of GaN based LEDs use a sapphire substrate in actual production.

However, lattice constant and thermal expansion coefficient are different between sapphire and GaN, and further their chemical characteristics are different from each other. Therefore, it is considered impossible to directly grow GaN single crystals on a substrate which is formed with these types of materials. As a result, despite various types of devisal and considerable improvement made thereby, an InGaN light-emitting device formed on a sapphire substrate has a problem in that it contains defect at a considerable density therein, and there is a limit for sufficiently improving light emission efficiency and device life.

In general, as methods for obtaining a single crystal film with superior crystallinity in heteroepitaxially growth with significant lattice misfit, there are two types of concepts to be considered as follows. Among the above two concepts, the present invention follows the concept of (1) described below.

(1) By growing a thin film via a material having an intermediate physical constant between a substrate and an epitaxial film, it is possible to improve the quality of the epitaxial film. That is to say, a thin film, the characteristics such as lattice constant, chemical characteristics and thermal expansion coefficient of which are intermediate, is intervened between the substrate and the epitaxial film. In this case, the single crystalline characteristic of the substrate needs to be inherited to the epitaxial film in the same single crystalline state as much as possible, and therefore, a single crystal thin film needs to be intervened therebetween.

(2) A polycrystal film of the same substance as the target single crystal thin film, or an amorphous film is intervened between the substrate and the epitaxial film. Normally, as the method for forming this type of film, there is used an epitaxial method such as an SOS (silicon on sapphire) method in which film formation is conducted by performing film formation at a temperature lower than the single crystal growth temperature. Moreover, in a GaN-on-sapphire method, successful results have been produced as a low temperature buffer layer. Furthermore, as the mechanism of this case, only crystal grains which have a high level of the nucleus generation density of GaN on the buffer layer, and which have a superior crystal orientation among these, are selectively grown and united to thereby suppress generation of the grain boundary, and the layer is flattened by utilizing the fact that growth rate in the lateral growth direction is high on the buffer layer.

"Conditions of Substrate Composed of Sapphire"

Conditions of the substrate 11 composed of sapphire which is suitably used in the present invention include the following conditions.

First, the surface of the substrate 11 composed of sapphire is cleaned sufficiently. The term cleaning in the description here means that items described in the following (1) to (4) are to be eliminated to the greatest possible extent.

(1) Particles, examples of which include abrasive agent residue and cutting-chips of sapphire.

(2) Extremely smooth concaves and convexes called surface flaws or latent flaws, which occur when being handled, and subtle changes in composition.

(3) An organic thin film in which organic substances floating in the air become attached on the surface.

(4) Particles which occur as a result of being in contact with a jig in a process, and waste which is present in the environment.

Furthermore, it is preferable that the degree of smoothness of the surface of the substrate 11 satisfies the following conditions.

The preferred single crystal orientation is the C-plane (0002).

(1) $Ra \leq 2$ Å is satisfied.

(2) It has an appropriate off angle of preferably 0.1 to 0.7 degrees, and more preferably it has an off angle of 0.3 to 0.6 degrees.

(3) The step of each plane is provided at a level where it can be observed on an atomic force microscope (AFM) or the like. A higher surface density is more preferred in this case.

(4) It is preferable that no protrusion other than the step produced as a result of providing the above off angle is present to the greatest possible extent.

As for the crystallinity of sapphire single crystals, a lower level of defects is better. However, since it is a substrate on which heteroepitaxial growth is conducted, it is important to ensure the above surface characteristics, and subtle differences in the crystallinity of the substrate will not significantly affect the characteristics of GaN after the epitaxial growth. Therefore, the method for growing sapphire single crystals may be decided while placing priority on cost above anything else.

Moreover, the present invention particularly exerts an effect in a case where the diameter of the substrate 11 composed of sapphire is 100 mm or greater.

"AlN Seed Layer"

The light-emitting device 1 of the present embodiment is such that on the substrate 11, there is formed the AlN seed layer 12 composed of a group-III nitride based compound.

As the group-III nitride based compound which constitutes the AlN seed layer 12, use of AlN single crystals is preferred.

The AlN seed layer 12 is preferably such that the full width at half-maximum (FWHM) of the X-ray rocking curve of the (0002) plane is 100 arcsec or less, and the FWHM of the (10-10) plane is 1.7° or less.

Generally, in the case of a group-III nitride based compound, the FWHM of the (0002) plane acts as an indicator of the crystal smoothness (tilt), whereas the FWHM of the (10-10) plane acts as an indicator of the dislocation density (twist) of the crystal. If the FWHM of the (0002) plane and the (10-10) plane of the AlN seed layer 12 is within the above range, the AlN seed layer 12 has superior crystallinity and orientation and it becomes a film with superior smoothness. As a result, each layer of the LED structure 20 to be formed thereon will have superior crystallinity.

The film thickness of the AlN seed layer 12 is preferably within a range of 10 to 50 nm, and more preferably within a range of 25 to 35 nm.

Moreover, in order to obtain the group-III nitride semiconductor light-emitting device of the present invention, it is preferable that the oxygen content in the AlN seed layer 12 is controlled at or below 5 atomic percent, by means of process control in a manufacturing method described later.

The AlN seed layer 12 in the present invention is a layer which is formed with single crystals and has a seed function, and it is provided in order to form a GaN film with superior crystallinity thereon.

In contrast, a so-called buffer layer, which is conventionally used, has a polycrystal structure formed with a columnar crystalline aggregate, it is a layer provided for mitigating its lattice misfit with the GaN layer thereabove, and it differs from the AlN seed layer 12.

<LED Structure>

As shown in FIG. 1, the LED structure 20 is of a structure such that on the substrate 11, via the AlN seed layer 12 described above, there are sequentially laminated the n-type semiconductor layer 14, the light-emitting layer 15, and the p-type semiconductor layer 16 respectively composed of a group-III nitride semiconductor.

"n-Type Semiconductor Layer"

The n-type semiconductor layer 14 is a layer which is normally laminated on the AlN seed layer 12 after having grown a base layer (undoped GaN). In the example described in the present embodiment, it is configured such that on a base layer 14a laminated on the AlN seed layer 12, there are further laminated an n-type contact layer 14b and an n-type cladding layer 14c. The n-type contact layer can also function as a base layer and/or an n-type cladding layer, whereas the base layer can also function as an n-type contact layer and/or an n-type cladding layer.

"Light-Emitting Layer"

The light-emitting layer 15 is a layer which is laminated on the n-type semiconductor layer 14, and the p-type semiconductor layer 16 is laminated thereabove. As this type of light-emitting layer, for example, in addition to a multiple quantum well structure, a single well structure may be employed. In the example described in the present embodiment, as shown in FIG. 1, a barrier layer 15a and a well layer 15b are alternately and repeatedly laminated, and are laminated in an order such that the barrier layer 15a is arranged on the n-type semiconductor layer 14 side and on the p-type semiconductor layer 16 side.

As the barrier layer 15a, for example, a gallium nitride-based compound semiconductor such as $Al_cGa_{1-c}N$ ($0 \leq c < 0.3$), which exhibits a larger band gap energy than that of the well layer 15b, may be suitably used.

Further, as the well layer 15b, for example, a gallium indium nitride such as $Ga_{1-s}In_sN$ ($0<s<0.4$) can be used as a gallium nitride-based compound semiconductor that contains indium.

The light-emitting layer 15 of the present embodiment is preferably such that the single layer thickness of each barrier layer 15a is within a range of 6 to 9 nm. Moreover, the light-emitting layer 15 is preferably such that the total thickness of a single barrier layer 15a and a single well layer 15b, which is adjacent to this single barrier layer 15a, is within a range of 8 to 12 nm.

Moreover, there are no particular limitations on the film thickness of the entire light-emitting layer 15. However, it is preferably a film thickness which substantially enables acquisition of quantum effect, that is to say, it is in a critical film thickness region, where the film thickness of the barrier layer 15a and the well layer 15b are within the above range. For example, the film thickness of the entire light-emitting layer 15 is preferably 500 nm or less, and the more preferable film thickness is approximately 100 nm. A film thickness of the entire light-emitting layer 15 in the above range contributes to an improvement in light emission output.

An active layer provided in the light-emitting layer 15, that is, the well layer 15b contains In, and therefore, the growth temperature needs to be low. However, there is a problem in that if a well layer containing In is grown at a low temperature, the crystallinity after film formation is reduced. Consequently, a barrier layer 15a, to which In is not added, is grown to thereby recover the crystallinity. Therefore, in order to recover the crystallinity as much as possible, the thickness of the barrier layer 15a is preferably as thick as possible. At this time, for example, it may be considered that the total thickness of the adjacent well layer and barrier layer is made approximately 150 Å for example. However, in this type of case, there is problem in that light emission intensity (brightness) is reduced.

In the present invention, by increasing the crystallinity of the AlN seed layer 12, the crystallinity of the n-type semiconductor layer 14 formed on this AlN seed layer 12 becomes superior. As a result, even in a case of a configuration in which the total thickness of the adjacent well layer 15b and barrier layer 15a is made thin in the light-emitting layer 15 formed on the n-type semiconductor layer 14, the crystallinity of each of these layers is suppressed from being reduced. Moreover, the light emission intensity of the light-emitting layer 15 becomes improved when the total thickness of the adjacent well layer 15b and the barrier layer 15a is thinner, and it is therefore possible to further improve the light emission intensity.

Meanwhile, in a case where the total thickness of the adjacent well layer 15b and the barrier layer 15a is made thin, there is also a problem in that leakage electric current will increase as a result of this.

Moreover, in a group-III nitride semiconductor light-emitting device, it is known that there is a correlation between the thickness of the well layer 15b and the light emission intensity of the light generated in the well layer 15b. As with the light-emitting device of the present invention, GaInN crystals (well layer 15b) formed on GaN crystals (n-type semiconductor layer 14) have compression strain therein due to difference in its lattice constant. At this time, a piezo-electric field is generated, a deviation occurs in the energy gap caused by the Stark effect due to this electric field, and this may cause a significant reduction in the light emission efficiency in some cases. Here, since the effect of the piezo-electric field is suppressed in a quantum well with a narrow well width, by making the well width narrow, that is to say, by thinning the thickness of the well layer, an improvement in the light emission intensity can be anticipated. However, as described above, in the case of a configuration with a thin well layer, leakage electric current increases if threading dislocation density is high, and therefore, there is a limit for narrowing the well width.

In the present invention, the AlN seed layer 12 of the above configuration is laminated on the substrate 11, and the n-type semiconductor layer 14 provided with the base layer 14a is formed thereabove, to thereby provide the n-type semiconductor layer 14 with superior crystallinity. By forming the light-emitting layer 15 on this n-type semiconductor layer 14 with superior crystallinity, occurrence of threading dislocation is suppressed in the well layer. As a result, leakage electric current in the well layer can be suppressed, and the light emission intensity can be significantly improved. That is to say, the thickness of the well layer 15b (well width) is restricted to a thin thickness within an appropriate range by using a wafer having the n-type semiconductor layer 14 with superior crystallinity formed thereon, having the thickness of the barrier layer 15a within the range of 6 to 9 nm (per single layer), and having the total thickness of the adjacent barrier layer 15a and the well layer 15b within the range of 8 to 12 nm. As a result, the above effect can be obtained.

As described above, in the light-emitting device of the present invention, by optimizing the structure of the light-emitting layer 15, which constitutes the LED structure 20, and the film formation conditions thereof, according to the crystallinity of the underlying n-type semiconductor layer 14 (GaN crystals), it is possible to significantly improve the light emission intensity.

Moreover, in the present invention, with the above configuration, it is possible to increase the crystallinity of both of the barrier layer 15a and well layer 15b which configure the light-emitting layer 15. Therefore, the crystallinity of the p-type semiconductor layer 16 described later which is formed on the barrier layer 15a on the topmost layer in the light-emitting layer 15, also improves.

"p-Type Semiconductor Layer"

The p-type semiconductor layer 16 is configured with a p-type cladding layer 16a and a p-type contact layer 16b. Further, the p-type contact layer may also function as a p-type cladding layer.

(Full Width at Half-Maximum of X-Ray Rocking Curve of p-Type Semiconductor Layer)

In the light-emitting device 1 according to the present invention, it is preferable that the LED structure 20 is laminated, via the AlN seed layer 12, on the substrate 11, the full width at half-maximum of the X-ray rocking curve of the (0002) plane of the p-type semiconductor layer 16 (p-type contact layer 16b in the present example), which serves as the topmost layer thereof, is 60 arcsec or less, and the full width at half-maximum of the X-ray rocking curve of the (10-10) plane is 250 arcsec or less. In the LED structure 20 formed with laminated group-III nitride semiconductors, if the FWHM of the topmost p-type semiconductor layer is within the above range, superior crystallinity can be obtained in the substantially entire LED structure 20. As a result, internal quantum efficiency significantly improves and a high level of light emission intensity can be obtained.

Conventionally, with a method practiced in general in which a low temperature buffer layer is used, in a case where the buffer layer is configured with AlN or AlGaN, the crystallinity of the buffer layer is in the order of several thousands to several tens of thousands arcsec (1° to 10°) in terms of FWHM. Therefore, even in a case where the crystallinity of the upper layer improves as a result of growing each layer, which constitutes the LED structure, on the buffer layer, the limit of the FWHM of the topmost p-type semiconductor layer has been considered approximately 100 arcsec for the (0002) plane and approximately 300 arcsec for the (10-10) plane.

In the present invention, since the crystallinity of the well layer 15b, which constitutes the light-emitting layer 15, is improved, it is possible to increase the growth temperature when forming the p-type semiconductor layer 16, and consequently, there can be achieved an effect in which the crystallinity of the p-type semiconductor layer 16 is improved as described in the manufacturing method mentioned later. As a result, in the present invention, there can be obtained a characteristic such that the full width at half-maximum of the X-ray rocking curve of the (0002) plane of the p-type semiconductor layer 16 (p-type contact layer 16b) is 60 arcsec or less, and the full width at half-maximum of the X-ray rocking curve of the (10-10) plane is 250 arcsec or less.

As described above, the FWHM, which indicates the crystallinity of the p-type semiconductor layer 16, which serves as the topmost layer of the LED structure 20, acts as an indicator of the crystallinity of the entire group-III nitride semiconductor light-emitting device. In the present invention, there is provided the configuration in which the FWHM of the (0002) plane and (10-10) plane of the p-type semiconductor layer 16 is within the above range, and thereby, the crystallinity of not only the p-type semiconductor layer 16 but also the entire light-emitting device 1 is increased. As a result, a high level of light emission intensity can be obtained.

<Electrodes>

The light-emitting device 1 of the present embodiment is such that a positive electrode is provided on the p-type contact layer of the p-type semiconductor layer 16 provided in the LED structure 20 having the above structure, and a negative electrode is provided on the n-type contact layer 14b of the n-type semiconductor layer 14.

"Positive Electrode"

The positive electrode provided in the light-emitting device 1 of the present embodiment comprises a translucent positive electrode 17 formed on the p-type semiconductor layer 16 (p-type contact layer 16b), and a positive electrode bonding pad 18 formed thereon.

The translucent positive electrode 17 is an electrode having translucency formed on the p-type semiconductor layer 16 of the LED structure 20 described above.

There are no particular limitations on the material used for the translucent positive electrode 17, and materials such as ITO ($In_2O_3$—$SnO_2$), AZO ($ZnO$—$Al_2O_3$), IZO ($In_2O_3$—$ZnO$), and GZO ($ZnO$—$Ga_2O_3$) can be used with use of a conventional method commonly known in this technical field. Moreover, as for the structure thereof, any structure may be used without any particular limitations, including any of the conventionally known structures.

As shown in FIG. 2, the positive electrode bonding pad 18 is an electrode formed on the translucent positive electrode 17 described above.

As the materials of the positive electrode bonding pad 18, the most commonly known structure is a configuration which normally comprises three layers of an ohmic bonding layer, a diffusion barrier layer, and a bonding layer, that is, three layer of Ti/Pt/Au. Moreover, as the metal which comes in ohmic contact with ITO, Cr, Ta, Zr, or the like may be used instead of Ti, and further, as the diffusion barrier layer, there may be used a configuration in which the above Pt is replaced with Mo, W, Rh, or the like.

In the LED structure 20 in which the n-type semiconductor layer 14, the light-emitting layer 15, and the p-type semiconductor layer 16 are sequentially laminated, the negative electrode 19 is formed so as to come in contact with the n-type contact layer 14b of the n-type semiconductor layer 14. Accordingly, in the process of forming the negative electrode 19, as shown in FIG. 1 and FIG. 2, by removing part of the p-type semiconductor layer 16, the light-emitting layer 15, and the n-type semiconductor layer 14, the exposed region 14d of the n-type contact layer 14b is formed and the negative electrode 19 is formed thereon.

As the material used for the negative electrode 19, the materials the same as the materials used for the above mentioned positive electrode bonding pad 18 may be used. Negative electrodes having various compositions and structures are commonly known, and any of these negative electrodes may be used without any particular limitations, with use of a conventional method commonly known in this technical field.

According to the group-III nitride semiconductor light-emitting device 1 of the present invention described above, there is provided a configuration such that the AlN seed layer 12 composed of a group-III nitride based compound is laminated on the substrate 11, and on this AlN seed layer 12, there are sequentially laminated each layer of the n-type semiconductor layer 14, the light-emitting layer 15, and the p-type semiconductor layer 16 respectively composed of a group-III nitride semiconductor, in which the full width at half-maximum of the rocking curve in the (0002) plane of the p-type semiconductor layer 16 is 60 arcsec or less, and the full width at half-maximum of the rocking curve of the (10-10) plane is 250 arcsec or less. As a result, each of the layers composed of the group-III nitride semiconductor is a layer having superior crystallinity, the internal quantum efficiency is improved, and it is consequently possible to obtain high level light emission output.

[Method for Manufacturing a Group-III Nitride Semiconductor Light-Emitting Device]

A manufacturing method of a group-III nitride semiconductor light-emitting device of the present embodiment is a method for manufacturing a group-III nitride semiconductor light-emitting device provided with a configuration such that the AlN seed layer 12 composed of a group-III nitride based compound is laminated on the substrate 11, and each layer of the n-type semiconductor layer 14, the light-emitting layer 15, and the p-type semiconductor layer 16 are respectively formed with a group-III nitride semiconductor and are sequentially laminated on the AlN seed layer 12, wherein in particular, the p-type semiconductor layer 16 is film-formed by means of a metal-organic chemical vapor deposition method (MOCVD method), and within a chamber of a film forming apparatus, the distance between a wafer having layers composed of a group-III nitride semiconductor formed on the substrate 11, and a shield which is provided parallel with the wafer's surface composed of the group-III nitride semiconductor, is 30 mm or less.

<Formation of AlN Seed Layer>

First, having conducted a pretreatment on the substrate 11, the AlN seed layer 12 composed of a group-III nitride based compound is film-formed on the substrate 11.

"Surface Plasma Treatment"

In the present invention, before forming the AlN seed layer 12 on the substrate 11, it is preferable that a plasma treatment is conducted on the surface of the substrate 11. In this type of surface plasma treatment, conditions such as voltage application method, type of gas, gas pressure, application power, and temperature are important parameters.

When a substrate composed of sapphire is arranged within the film forming apparatus which generates plasma in a vacuum and the AlN seed layer 12 composed of AlN single crystals is formed, as described above, even in a case where the surface of the substrate 11 is sufficiently cleaned, in general, a certain amount of time is required from the moment of the completion of cleaning and drying the substrate 11 to the moment of placing it into the film forming apparatus. For example, even if the substrate 11 is vacuum-packed inside a clean room and is taken out inside the clean room, in general, the substrate surface extensively changes, depending on the situation. Consequently, it is preferable that the substrate 11 is transported into the vacuum film forming apparatus, and then the surface of the substrate 11 is conditioned with use of plasma before forming a film.

"Voltage Application Method"

Method for generating plasma inside the chamber of the film forming apparatus can be broadly classified into a total of four types of method, depending on whether the applied voltage is DC or RF, and whether the subject of voltage application is a target or a substrate in those cases where the chamber is earthed. Here, the facts that the substrate 11 is composed of sapphire that has an insulation property, and that if atoms of the target are ejected they may possibly become attached to the substrate surface, and the ejected atoms are not used for generating plasma. Based on these two points while taking into consideration the purpose of conditioning the surface of the substrate 11 before conducting film formation, the method of applying RF voltage to the substrate side is preferred.

"Type of Gas"

When conducting a plasma treatment on the surface of the substrate 11, there are no particular limitations on the type of gas to be used for generating plasma, and a type of gas may be appropriately selected for use. However, the main purpose of this process is to sweep organic substances on the substrate surface, and it is thought that if atoms on the surface of the substrate composed of sapphire are ejected, the step of the substrate surface is disturbed. Consequently, in the process of the surface plasma treatment, it is difficult to use a highly reactive gas. Moreover, even in a case where an inactive gas is used, the destructive power of heavy atoms is overwhelming as with the above case and thus it is not preferable, and consequently use of He, $H_2$, or the like may be considered. However, there is a problem in that plasma discharge cannot be easily stabilized, and if Ar is mixed until it has been stabilized, the destructive power of Ar becomes a problem. Therefore, use of $O_2$ or $N_2$ is preferred in the surface plasma treatment. However, if $O_2$ gas remains inside the chamber, even with an extremely small amount, it becomes an obstacle to crystal growth when conducting AlN sputtering in the next process, and therefore use of this should be preferably avoided. Therefore, when conducting a plasma treatment on the surface of the substrate 11, a treatment with use of $N_2$ plasma is preferred. Moreover, for the purpose of maintaining the stability of plasma, needless to say, Ar may be mixed.

"Application Power and Gas Pressure"

The lowest possible level of the input power is preferable when conducting a surface plasma treatment on the substrate, and it may be at the lowest level as long as plasma can be stably maintained. For the size of a chamber and cathode used in a conventionally known sputtering film forming apparatus, the appropriate range of input power is approximately 10 to 100 W.

Moreover, if the gas pressure is too high, particles collide with each other and start to lose their kinetic energy. On the other hand, if the gas pressure is low, particles with a high level of kinetic energy collide with the substrate surface, and therefore, a high pressure within a range where the plasma can be stably maintained is preferred. If the gas pressure is forced to rise, a high level of power is required in order to maintain the stability of the plasma, however, if the power exceeds 100 W, defects are introduced at a level more than that of conditioning the substrate surface. Therefore, the appropriate gas pressure range when conducting a surface plasma treatment is 0.8 to 1.5 Pa.

"Temperature"

For the purpose of conditioning the surface of the substrate 11, temperature is not a very important parameter, and the purpose can be achieved at any temperature in a given range from room temperature to 1,000° C. However, this is a process to be performed immediately before conducting film formation, and therefore, temperature the same as the film formation temperature for the AlN seed layer is preferred from an industrial production point of view. If the temperature in the surface plasma treatment is too high, damage to be made to the substrate may possibly become too significant. Here, the term "too high temperature" refers to a temperature which exceeds 800° C. for example.

Moreover, the surface plasma treatment may also be conducted in another chamber which is different from the chamber for conducting the film formation process of the AlN seed layer 12. The advantage in this case is that the throughput can be increased and the temperatures can be separately set. On the other hand, the disadvantage of this is that the duration of time from the surface plasma treatment to the next film formation is long, and there is a possibility that contamination may occur in the substrate surface.

"Film Formation Process of AlN Seed Layer"

Following the surface plasma treatment, the AlN seed layer composed of AlN single crystals is film-formed on the substrate 11.

The term single crystal here in the description refers to crystals which have no crystal grain boundary and have the same crystal orientation in all portions thereof. However, in general, unless it is a perfect crystal, some kind of defect is present in any crystal, and the crystal orientation subtly changes within the crystal, depending on the arrangement of the defect. Therefore, it is difficult to make a clear distinction whether the degree of defects makes them poly-crystals or single crystals. In the present example, in the AlN seed layer on the substrate composed of sapphire, the target state is such that the grain boundary is not visible in a 200 nm viewing field scale with a TEM cross-sectional observation, and the respective conditions described below need to be satisfied in order to realize this target.

If a thin film of a C-plane is taken into consideration, as for so-called crystallinity, first, the width of the diffraction peak of the X-ray rocking curve (XRC) of the (0002) plane is an issue. If this diffraction peak is sufficiently sharp, the state is assumed such that planes with no defects are arranged in a line while plane intervals are constant.

Next, the sharpness of the XRC (FWMH) serves as a measure of determining whether it is oriented in the same direction at any location within a plane. If there is a disturbance in the FWMH, crystals may possibly grow in random directions, and a flat and smooth plane cannot be ensured. Therefore, as for the crystallinity of the AlN seed layer, superior alignment of the (0002) plane is a prerequisite.

Next, in the (10-10) plane, the full width at half-maximum of the peak of the XRC serves as an indicator which indicates an approximate degree of presence of partially rotated locations when seen from the direction perpendicular to this plane. Defects which penetrate in the direction of the C-axis direction is generated if this indication is bad, and therefore, this is an important parameter to ensure withstanding voltage. However, the AlN seed layer is not considered to be a problem as long as a noncontiguous boundary is absent.

When the present inventors observed several tens of viewing fields of a sample having 1.5 degrees of the full width at half-maximum of the XRC of the (10-10) plane, using a planar TEM, it was confirmed that no noncontiguous grain boundary was present. Therefore, the level at or below this is not considered to be a problem.

Moreover, if the full width at half-maximum (FWHM) of the rocking curve of the X-ray diffraction of the (0002) plane and (10-10) plane of the AlN seed layer are respectively less than or equal to 100 arcsec and 1.7 degrees, GaN with superior crystallinity can be epitaxially grown thereon. In this case, the crystallinity of the topmost p-type semiconductor layer 16 (p-GaN layer) of the LED structure 20 can be obtained at a level where the FWHM of the XRC of the (0002) plane and (10-10) plane are respectively 60 arcsec and 250 arcsec.

Important parameters in the process of forming the AlN seed layer 12 in the manufacturing method of the present invention include target type, voltage, method of magnetic field application, gas type, distance between the target and substrate, shape of the plasma and volume for confining the plasma, gas pressure, application power, and film formation temperature. Hereunder, the respective conditions are described.

"Target Type, Voltage, and Method of Magnetic Field Application"

The method for generating plasma inside a chamber can be broadly classified into a total of four types of method, depending on whether the applied voltage is DC or RF, and whether the subject of voltage application is a target or a substrate in those cases where the chamber is earthed.

Moreover, as for the target for forming the AlN seed layer, there may be considered a method in which high purity AlN is used as a target, and a method in which $N_2$ gas is introduced while using high purity Al as a target, and the $N_2$ is decomposed with plasma so as to have Al and N react with each other. However, if high purity AlN powder is to be sintered, there is a problem in that a sintering aiding agent such as $CeO_2$ needs to be introduced, and it is difficult to obtain a high-purity dense AlN target. Here, high purity Al with a purity of at least 5N or higher is required for the purpose of the present invention. However, high purity Al with a purity level up to 6N is commercially available and it can be easily ensured.

Furthermore, in a case of using DC to generate discharge, it is essential that the target is a conductive material. Therefore, in a case where high purity AlN is used for the target, naturally, the method of applying electric voltage needs to be RF. If the target is high purity Al, there is a possibility that the application method may be appropriately selected between DC and RF. However, in a case where high purity Al is used as the target, AlN may be produced on the Al surface and it may become insulated in some cases. In this type of case, electrical charges are accumulated and a ground discharge phenomenon occurs. Therefore, in the case of DC, the application method needs to be pulse application so that no AlN film is produced on the Al surface.

The merit and demerit of the respective DC sputtering and RF sputtering are described below.

In a case where DC sputtering is used, there is a merit in that an inexpensive power supply may be used and control can be performed easily, and since the cathode and anode can be identified clearly, it is easy to control the location to be hit by the plasma and the location where a film is to be formed, and further, an impurity reduction design can be easily made. On the other hand, there is a demerit in DC sputtering in that the range where discharge becomes stable and the range of kinetic energy are narrow.

In a case of using the RF sputtering, there is a merit in that the range where discharge becomes stable and the range of kinetic energy are wide. Meanwhile, there is a demerit in the RF sputtering in that in addition to a problem in that power supply is expensive, a matching box is required, and it takes a long time until discharge is commenced, since the cathode and anode cannot be identified clearly, particles are ejected from any position of the shield by the plasma, and further, it is difficult to make an impurity reduction design.

In both of the DC sputtering and RF sputtering, a magnetic field needs to be made in order to stabilize the plasma. As the method of applying a magnetic field, there are two types of method, namely, a method of using a permanent magnet, and a method of using an electromagnet, and a magnet is moved in order to equalize the magnetic field in many cases. Here, in a case where the target is of a circular shape, a permanent magnet is rotated in general, and moreover, in a case where the target is of a quadrangular shape, the permanent magnet is reciprocated in general. Moreover, if the permanent magnet cannot be arranged in a favorable manner, there is a type of electrode called an ICP electrode in which a coil is placed on the outer side.

Moreover, the plasma density is dependent mainly on the intensity of the magnetic field, and therefore, the intensity of the magnetic field needs to be uniform in order to achieve an even film thickness. For this reason, a method which combines various types of magnetic field generation methods is employed frequently.

Taking into consideration all the conditions described above, in a case of film-forming an AlN seed layer, the RF discharge which uses a high purity Al target is most suitable.

"Type of Gas"

In the process of forming the AlN seed layer, as for the type of gas for generating plasma, Ar may be used alone as long as the target is AlN, however, if the target is Al, Ar and $N_2$ are required. If the gas is only $N_2$ in the case where the target is Al, there is a problem in that it becomes AlN before Al atoms are ejected and the film formation rate is hardly increased. Further, if the gas is only Ar, a thin film of metallic Al is formed.

Here, an AlN film is formed as the amount of $N_2$ is increased, and if the partial pressure of $N_2$ gas is low, N in AlN becomes insufficient, and the formed film will become colored. Moreover, in order to nitride ejected atoms from Al appropriately, the amount of $N_2$ needs to match with the number of the ejected Al atoms. If the amount of $N_2$ is excessive, a large amount of defects is introduced to the AlN film, and the film becomes colored. Therefore, it is preferable that a gas in which Ar and $N_2$ are mixed at an appropriate ratio is to be used.

Moreover, the appropriate ratio of Ar and $N_2$ changes, depending also on the gas pressure and application power. Here, the speed at which Al is ejected is dependent on the application power, however, it is not dependent on gas pressure. However, the activation rate of $N_2$ becomes higher when the gas pressure is lower. For this reason, the ratio of Ar needs to be lowered in a case where the gas pressure is low, and further, the ratio of Ar also needs to be lowered in a case where the application power is high.

As the nitrogen material used in the present invention, any generally known compound such as $NH_3$ can be used without any problems. In a case where nitrogen gas ($N_2$) is used as the nitrogen material, a simple apparatus may be used, however, there is a problem in that N2 is an extremely stable and activation thereof is difficult, and therefore, a high reaction rate cannot be achieved. The present invention utilizes an effect in which by placing a substrate composed of sapphire into plasma, $N_2$ is activated in the vicinity of the substrate surface. As a result, there can be obtained an approximate film formation rate which may be inferior to ammonia but which can be utilized.

"Distance Between Target and Substrate"

In a case where the diameter of the substrate composed of sapphire is 100 mm, the approximate diameter of the target needs to be 200 mm in order to uniformly form a film on the entire surface. As described above, when conducting sputtering film formation, generally a magnetic field is applied in order to stabilize the plasma. However, the magnet is normally arranged on the back side of the target. In this case, the magnetic field is concentrated on the target surface, and accordingly, the level of plasma density becomes higher on the target surface.

In the present invention, since the purpose here is to let plasma particles having a high level of energy react with each other on the substrate surface, the substrate needs to be arranged at a position where the plasma density is as high as possible. If the distance between the target and the substrate is too long, it is not preferable as it becomes impossible to place the substrate at the position where the plasma density is high. Moreover, in a case where the diameter of a substrate is 100 mm and a target with 200 mm diameter is used, the appropriate distance between the target and the substrate is approximately 40 to 80 mm.

"Shape of Plasma and Volume for Confining Plasma"

When conducting the process of forming the AlN seed layer, if the plasma reaches the wall surface of the chamber, the wall surface becomes contaminated and removal of this contamination is difficult. Therefore, in general, a shield for confining the plasma is installed inside the chamber for use. The shield does not only prevent the chamber wall surface from being soiled, but it also has a function to serve as an electrode when earthed to the chamber, and it regulates the shape of the plasma.

Here, evacuation efficiency needs to be increased in order to increase the level of vacuum inside the chamber, and in order to realize this, use of a chamber with the smallest possible size is preferable. However, if the plasma is confined within a too small space, there is a problem in that the shield is hit by the plasma, and the material component of the shield also gets mixed in the film. In particular, water molecules are almost always attached on the surface of the shield, and if these water molecules are hit by the plasma and discharged, OH and O penetrate into the film to be sputtering-formed.

Therefore, the size of the shield needs to have a dimension which allows the shield to be arranged distanced from the target to some extent, rather than a dimension which is only sufficient just to surround the target. For this reason, in a case where a target with 200 mm diameter is used, a shield having at least 300 mm diameter is required.

"Gas Pressure and Application Power"

In the process of forming the AlN seed layer, it is considered that the base pressure basically determines the quality of a film.

In the present invention, a high level of vacuum showing a pressure of $2.0 \times E^{-5}$ Pa or less is required. If the level of vacuum is inferior to this, impurities such as O present in the atmosphere inside the chamber get mixed in the formed AlN seed layer, and defects are introduced into the crystals. Moreover, also in a case where the base pressure is sufficiently lowered, when generating plasma, impurities such as water content attached on the shield surface are ejected, and the film quality may be reduced in some cases.

Furthermore, if the gas pressure is excessively high, there is a problem in that particles collide with each other in the plasma, and lose their kinetic energy. In a case of film-forming single crystals, Al and N having a high level of kinetic energy need to react with each other on the substrate surface, and therefore an excessively high gas pressure is not preferable. However, if the gas pressure is lowered excessively, it is not preferable because the amount of $N_2$ plasma particles which collide with the Al target increases. For this reason, the appropriate range of gas pressure is 0.3 to 0.8 Pa, which is the generally used gas pressure in the sputter film formation.

The application power in the process of forming the AlN seed layer is proportionate to the film formation rate, and therefore, a sufficient film formation rate cannot be achieved if this is too low. Moreover, residue gas components such as $O_2$ and $H_2O$ present in the atmosphere inside the chamber inevitably penetrate into the film. However, the amount of these penetrating into the film is considered constant per predetermined period of time. For this reason, it is not preferable as the penetrating amount relatively increases if the film formation rate is low, and consequently the purity of the film is reduced. Therefore, the highest possible film formation rate is required, and accordingly higher application power is preferred. However, if the application power is excessively high, the shield is directly exposed to plasma, and consequently, impurities are ejected from the shield. Therefore, in a case where a target with 200 mm diameter is used, the appropriate application power is approximately 500 to 2,500 W.

Moreover, the appropriate gas pressure changes according to the application power. If the application power is high, even when it is within an appropriate range, a comparatively high gas pressure is preferred, and if the application power is low, even when it is within an appropriate range, a relatively low gas pressure is preferred.

"Film Formation Temperature"

The preferable substrate temperature at the time of forming the AlN seed layer is in a range of 300 to 800° C. If the substrate temperature is below 300° C. at the time of forming the AlN seed layer, the distance for atom movement becomes insufficient after atoms reach the substrate and create single crystals. As a result, the entire substrate cannot be covered, and pits start to be produced. Moreover, from a view point of creating single crystals on the substrate surface, it is advantageous to raise the temperature to a temperature at which AlN starts to be decomposed. This temperature is approximately 1,200° C., and therefore the upper limit of the temperature is even higher. However, since the temperature of a fixing jig, a shield, and the like around the substrate also rise in parallel, degassing from these types of locations increases and the amount of impurities getting mixed in the film increases. As a result, a good result cannot always be obtained even if the temperature is set high.

Therefore, in the actual process, it is preferable that the film formation temperature is set not higher than 800° C. However, if a structure which can maintain a high level of vacuum can be achieved, it becomes even more advantageous from a viewpoint that crystallinity is improved when film formation is conducted at a higher film formation temperature.

"Oxygen Concentration in AlN Seed Layer"

In the manufacturing method of the present invention, in order to obtain the above group-III nitride semiconductor lamination structure, it is preferable that the process is appropriately controlled so that the oxygen content in the obtained AlN crystal film is 5 atomic percent or less.

The film thickness of the AlN seed layer 12 formed under the respective conditions described above is preferably within a range of 10 to 50 nm, and more preferably within a range of 25 to 35 nm.

<Formation of LED Structure>

In the manufacturing method of the present embodiment, on the AlN seed layer 12 which is formed on the substrate 11, there is formed the LED structure 20 formed with a group-III nitride semiconductor. In this example, the employed method is such that each layer which constitutes the LED structure 20 is formed by means of a conventionally known MOCVD method.

"Formation of n-Type Semiconductor Layers (Base Layer, n-Type Contact Layer, and n-Type Cladding Layer)"

When forming the LED structure 20, first, the base layer 14a of the n-type semiconductor layer 14 is laminated and formed on the AlN seed layer 12. Subsequently, on the base layer 14a, there are formed the n-type contact layer 14b and the n-type cladding layer 14c. At this time, each layer of the base layer 14a, the n-type contact layer 14b, and the n-type cladding layer 14c can be formed with use of the same MOCVD apparatus.

"Method for Growing Base Layer (GaN Single Crystals)"

Once the AlN seed layer 12 composed of AlN single crystals is formed on the substrate 11 composed of sapphire, growing GaN (group-III nitride semiconductor) single crystals thereon is close to epitaxial growth, and it is comparatively easy. At this time, with use of a MOCVD (metal-organic chemical vapor deposition method) method, which has been conventionally practiced, a GaN single crystal structure with a low level of defect density can be grown. As for this type of MOCVD method, a conventionally known general method may be used. An overview thereof is as follows.

In the MOCVD method described in the manufacturing method of the present invention, hydrogen ($H_2$) or nitrogen ($N_2$) can be used as the carrier gas, trimethyl gallium (TMG) or triethyl gallium (TEG) can be used as the Ga source which represents the group-III raw material, trimethyl aluminum (TMA) or triethyl aluminum (TEA) can be used as the Al source, trimethyl indium (TMI) or triethyl indium (TEI) can be used as the In source, and ammonia can be used as the N source which represents the group-V raw material.

Moreover, as the n-type impurity of the dopant element, monosilane ($SiH_4$) or disilane ($Si_2H_6$) can be used as the Si raw material. Moreover, for the p-type impurity of the dopant element, for example, biscyclopentadienyl magnesium ($Cp_2Mg$) or bisethylcyclopentadienyl magnesium ($EtCp_2Mg$) can be used as the Mg raw material.

Furthermore, as the carrier gas to be supplied when forming the GaN (group-III nitride semiconductor) single crystal film, a general carrier gas may be used without any particular restrictions. That is to say, hydrogen or nitrogen, which are widely used in gas-phase chemistry film forming methods such as MOCVD, may be used.

Furthermore, as the temperature of the substrate 11 at the time of film formation, it needs to be a temperature lower than the temperature at which GaN starts to be decomposed. As for the research results in regards to the temperature at which GaN starts to be decomposed, various data have been reported, depending on the measurement method. Although a precise value has not been revealed, it has been revealed that it starts to be decomposed when the temperature thereof exceeds 950° C., and it is certainly decomposed at 1,000° C. or higher. It is considered that this decomposition temperature is dependent on the crystallinity of GaN, and decomposition starts from a location where crystalline defects are present. Therefore, the decomposition temperature is higher for crystals having a low level of defects. For this reason, if the crystals are grown at a temperature at which decomposition subtly starts, the portion with defects gets decomposed, and only the portion having no defects remains. Therefore, setting of the substrate temperature is extremely important in order to grow crystals while keeping the level of defects as low as possible. Accordingly, in a case where film formation is conducted at an appropriate temperature, it is possible, with the above mechanism, to reduce defects as the growth progresses.

Here, the GaN crystals in the vicinity of the interface between GaN single crystals (base layer here) and AlN single crystals (AlN seed layer) contain a relatively higher amount of defects. If the GaN single crystals (base layer) are grown with a constant thickness, defects are gradually lost, and it is possible to obtain single crystals with an extremely low level of defect density. The minimum thickness required for losing crystal defects is at least 2 μm, and in order to obtain sufficient crystallinity, a thickness in a range of 4 to 8 μm is required in general. Even in a case where the thickness of GaN (base layer) is greater than the above range, the effectiveness is reduced, the warp in the substrate becomes greater, and cracks may start to appear in the crystals in some cases. Moreover, if the warp in the substrate becomes too significant, the photolithography treatment in the device manufacturing process in which the electrodes are formed, becomes difficult.

The crystallinity of the GaN single crystal film which is grown on the AlN seed layer 12 composed of AlN single crystals, achieves an extremely good level.

Here, the indicator for quantifying the crystallinity is described again. In the present invention, as a crystallinity indicator, the FWHM of the rocking curve of the X-ray diffraction of the (0002) plane and (10-10) plane of the GaN crystals (full width at half-maximum for (0002) and (10-10) diffraction) is used.

In the present invention, the preferable crystallinity of the base layer composed of GaN single crystals is such that the full width at half-maximum of the rocking curve of the (0002) plane is 100 arcsec or less, and the full width at half-maximum of the rocking curve of the (10-10) plane is 300 arcsec or less. The FWHM of the (10-10) plane is said to have a correlation with the amount of threading dislocation, and this means that the amount of threading dislocation is extremely low. However, the light emission efficiency of the light-emitting device correlates with the amount of threading dislocation. This is because, the light emission efficiency is an indicator which indicates how much electric current among the electric current having flowed between the p-type semiconductor layer 16 (p-GaN) and the n-type semiconductor layer 14 (n-GaN), has been converted to light. However, if any electric current flows via threading dislocation, the light emission efficiency is reduced by that much.

Here, the growth of the base layer 14a composed of GaN is basically the same as the case of growing it on a low temperature buffer layer which uses AlN or GaN. However, as for the growth temperature, since there is an idea of selecting a temperature which is very close to the temperature at which decomposition starts, the growth temperature can be made higher when the density of defect is lower as described above. In the present invention, the base layer 14a composed of GaN single crystals grows from the top of the AlN seed layer 12 composed of AlN single crystals, and therefore it is possible to grow it from a location where the density of defects is comparatively low.

Here, the relationship between the base layer 14a and AlN seed layer 12, and the crystallinity is further described.

In a case of using a conventional buffer layer composed of AlN or GaN, the crystallinity of the buffer layer is in the order of several thousands to several tens of thousands arcsec for the (0002) plane in terms of FWHM, and FWHM cannot be measured for the (10-10) plane. In contrast, the crystallinity of the AlN seed layer 12 composed of AlN single crystals in the present invention is such that the full width at half-maximum (FWHM) of the rocking curve of the X-ray diffraction of the (0002) plane and (10-10) plane are respectively 60 arcsec and 1.5 degree or less.

As for the base layer 14a composed of GaN single crystals, for the (0002) plane, GaN single crystals may inherit the crystallinity thereof. Moreover, as for the (10-10) plane, the level of crystal defects decreases while growing the GaN single crystals. Furthermore, at this time, even if the mechanism of reducing defects during the growth is similar to that in the MOCVD method, the density of remaining defects at the time of starting the film formation is completely different. Therefore, as has been conventionally seen, for example, even if the film, which became polycrystals at the time of starting the film formation, is thickly laminated under the most appropriate conditions, it is extremely difficult to make the FWHM of the (10-10) plane 300 arcsec or less.

Hereunder, there is described a reason of the improvement in the crystallinity of the GaN above the AlN seed layer 12 described above, achieved by forming it as an AlN single crystal film by means of a sputtering method.

Figure 4:
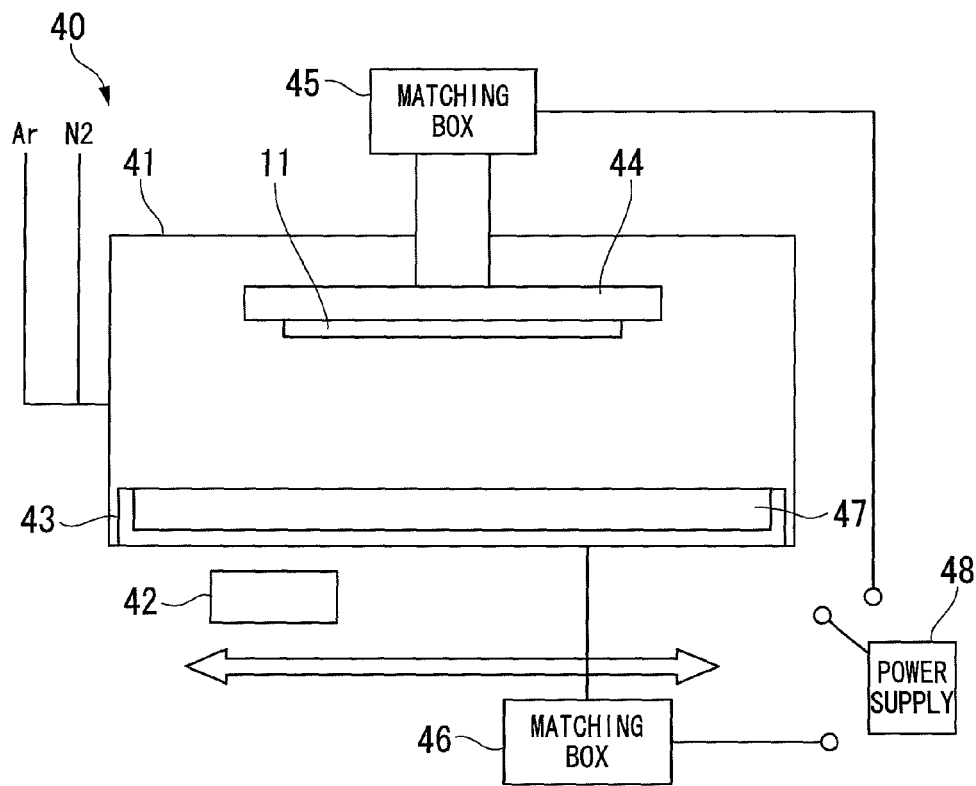
FIG. 4 is a diagram for schematically describing an example of a method for manufacturing the group-III nitride semiconductor light-emitting device according to the present invention, and is a schematic diagram showing a sputtering apparatus used for forming an AlN seed layer.

First, a sputtering apparatus 40 of the example shown in FIG. 4 is used, an Al target is installed as a target 47, Ar and $N_2$ are introduced into the interior of a chamber 41, and the pressure therein is adjusted to a range of 0.1 to 10 Pa. Next, when electric voltage is applied between the target 47 and the chamber 41 by an RF power supply 48, electrical discharge occurs inside the chamber 41 and plasma is generated. As a result, Al atoms are pushed out of the target 47. If Al atoms and N atoms reach the surface of the substrate 11, these atoms have received extremely large kinetic energy from the plasma, and consequently, they can move within a considerable range. Since energy of the grain boundary in the AlN crystals is extremely large, crystals are most stable when they become a single crystalline structure with completely no grain boundaries. Therefore, the above AlN crystals exert the effect of shifting themselves to single crystals with no grain boundaries if the atoms can move.

Furthermore, since the organization structure of GaN differs from that of sapphire which constitutes the substrate, it cannot grow GaN single crystals on the substrate without any modification. Conventionally, there has been employed a method for obtaining a wafer by forming a GaN crystal layer called a low temperature buffer layer on the substrate, and by laminating GaN single crystals thereon. However, since the crystallinity of the above type of low temperature buffer layer is not high on any account, the crystallinity of GaN has its limit in the case of using this type of low temperature buffer layer, and the limit of the crystallinity of the topmost p-type semiconductor layer when laminating an LED structure has been considered approximately 100 arcsec for the (0002) plane and 300 arcsec for the (10-10) plane in terms of FWHM.

The manufacturing method of the present invention is a method based on the concept that epitaxial growth is conducted via a material having intermediate physical constants between the substrate and the epitaxial film, and thereby the quality of the epitaxial film can be improved. Therefore, in order to grow a GaN layer on a sapphire substrate, growth via an AlN seed layer is considered effective. This is due to an effect that AlN has a lattice constant and a thermal expansion coefficient respectively intermediate between sapphire and GaN, and consequently the lattice misfit and thermal distortion are efficiently mitigated.

Moreover, AlN and GaN have very close chemical characteristics, and interface energy therebetween is small. This may be judged as follows from a different viewpoint.

Sapphire ($Al_2O_3$) is an oxide, and the nitride compound which is the most chemically close to this is AlN with Al being a common factor therebetween. Although the lattice misfit between them is 11% and is comparatively high, they are likely to grow AlN single crystals due to Al being the common atoms therebetween. Furthermore, since GaN is the only compound, which can make a sold solution with AlN and their chemical characteristics are the closest to each other, and the lattice misfit therebetween is only 2%. Consequently, although it is difficult to directly grow GaN/$Al_2O_3$, if AlN intervenes as with GaN/AlN/$Al_2O_3$, the crystallinity of sapphire ($Al_2O_3$) is inherited and GaN single crystals can be grown. Therefore, as long as a flat AlN seed layer can be formed while remaining in the state of being single crystals, it is possible to considerably improve the GaN film quality of the heteroepitaxial film which grows thereon.

For the reason described above, AlN is the most suitable material as a thin film material having intermediate physical characteristics when conducting heteroepitaxial growth, and a reactive sputtering method is a suitable method for forming a film of this AlN as a single crystal structure with superior crystallinity. Therefore, by forming the AlN seed layer 12 as AlN single crystals by means of the reactive sputtering method, GaN with an extremely high level of crystallinity can be formed thereon, and consequently, it is possible to improve the crystallinity of the entire LED structure 20.

"Formation of n-Type Contact Layer (n-GaN) and n-Type Cladding Layer (n-clad)"

As shown in FIG. 1, the n-type contact layer 14b and the n-type cladding layer 14c are sequentially laminated on the base layer 14a composed of GaN single crystals, to thereby form the n-type semiconductor layer 14. To each of these layers, the n-type impurity described above is doped.

"Formation of Light-Emitting Layer (Barrier Layer, Well Layer)"

The light-emitting layer 15 is formed on the n-type cladding layer 14c by means of a conventionally known MOCVD method. The light-emitting layer 15 to be formed in the present embodiment, which is illustrated in the example of FIG. 1, has a laminated structure which starts with a GaN barrier layer and ends with a GaN barrier layer, and it is formed by alternately laminating six layers of the Si-doped barrier layers 15a composed of GaN and five layers of the =doped well layers 15b composed of GaN.

Between the n-type semiconductor layer 14 and the p-type semiconductor layer 16, there is formed a GaInN layer (light-emitting layer 15) for controlling wavelength. This type of light-emitting layer (GaInN layer) 15 is normally formed in a manner such that an n-type GaN layer, which serves as a barrier layer (barrier layer) referred to as a multiple quantum well structure, and a GaInN layer, which serves as a well layer (well layer) are alternately laminated. Here, the light-emitting layer 15 formed in a multiple quantum well structure is not formed in a structure of being directly sandwiched by the n-type contact layer 14b (n-GaN) and the p-type contact layer 16b (p-GaN), and it is formed in a structure such that the n-type cladding layer 14c (n-clad: n-GaInN) intervenes between the n-type contact layer 14b and the light-emitting layer, and the p-type cladding layer 16a (p-clad: p-GaAlN) intervenes between the p-type contact layer 16b and the light-emitting layer 15.

In the process of growing the light-emitting layer 15, TMI is supplied. That is to say, there is employed a process of intermittently supplying In while controlling the time of growth. The carrier gas at this time is $N_2$.

As for the film thickness of the barrier layer 15a (n-type GaN layer) and the well layer 15b (GaInN layer), there is selected a condition under which light emission output is highest. Having decided the optimum film thickness, the supply amount of group-III raw materials and the growth time are appropriately selected.

Moreover, the preferred growth temperature for the light-emitting layer 15 is in a range of 700° C. to 1,000° C. as the susceptor temperature. However, in the process of growing the well layer 15b, if the growth temperature is too high, inclusion of In during the film growth becomes difficult, and the amount of In required for emitting light at a predetermined wavelength cannot be incorporated as a solid solution. For this reason, the growth temperature of the well layer 15b is preferably selected within a range of very high temperatures.

On the other hand, it is easier to maintain the level of the crystallinity of the barrier layer 15a when the growth temperature is as high as possible. However, if the growth temperature of the barrier layer 15a is too high, GaInN constituting the well layer 15b gets decomposed, and therefore it is preferable that the growth temperature is set in consideration of this type of aspect.

In the growth of the light-emitting layer 15, the barrier layer 15a is formed as the last one layer, that is, the topmost layer, and the process is complete (final barrier layer).

"Formation of p-Type Semiconductor Layer (p-Type Cladding Layer, p-Type Contact Layer)"

On the light-emitting layer 15, that is to say, on the barrier layer 15a that serves as the topmost layer of the light-emitting layer 15, there is formed, by means of a MOCVD method, the p-type semiconductor layer 16 formed with the p-type cladding layer 16a and the p-type contact layer 16b.

In the present embodiment, first, the Mg-doped p-type cladding layer 16a composed of $Al_{0.1}Ga_{0.9}N$ is formed on the light-emitting layer 15 (topmost barrier layer 15a), and further, the Mg-doped p-type contact layer 16b composed of $Al_{0.02}Ga_{0.98}N$ is formed thereon. At this time, the same MOCVD apparatus may be used for laminating the p-type cladding layer 16a and the p-type contact layer 16b.

"Formation of p-Type Contact Layer (p-GaN)"

The p-type contact layer 16b (p-GaN) is grown in a procedure described below.

First, TMG, TMA, and $Cp_2Mg$ serving as a dopant, along with the carrier gas (hydrogen, nitrogen, or a mixture gas of both) are supplied onto the p-type cladding layer 16a described above. The preferred growth temperature at this time is in a susceptor temperature range of 980 to 1,100° C., and is in a wafer temperature range of 830 to 970° C. If the growth temperature is lower than this range, an epitaxial layer with a low level of crystallinity is formed, and the hole density in the p-type contact layer 16b cannot increase. Moreover, if the growth temperature is higher than the above range, there is a possibility that GaInN of the well layer 15b in the light-emitting layer 15 position therebelow may be decomposed, and In may be deposited.

There are no particular limitations on the growth pressure for the p-type contact layer 16b, however, the preferred pressure is 50 kPa (500 mbar) or less. When the growth pressure is 50 kPa (500 mbar) or less, the concentration distribution of Mg which has been supplied as a dopant becomes uniform in the two dimensional direction in the p-type contact layer 16b (in-plane direction of the growth substrate). The Mg concentration in the p-type contact layer 16b may be measured, using a general mass spectrometer device (SIMS).

Moreover, the film thickness at the time of growing the p-type contact layer 16b is preferably in a range of 50 to 300 nm, and more preferably 100 to 200 nm.

The growth rate of the p-type contact layer 16b can be obtained by measuring the film thickness of the p-type contact layer 16b with a TEM observation of the wafer's cross-section or with a spectral ellipsometry, and by dividing the film thickness by the growth time.

(Process of Supplying a Large Amount of Only $CP_2Mg$ in a Short Period of Time Before Formation)

In the light-emitting device manufacturing method of the present invention, it is considered that the crystallinity of GaN can be raised more easily and Mg doping efficiency is improved when the growth temperature is as high as possible at the time of forming the p-type semiconductor layer 16. However, when growing the p-type semiconductor layer 16 (p-GaN), the light-emitting layer 15 (MQW layer) which contains InGaN is present in the layer immediately therebelow. The decomposition temperature of InGaN becomes lower as the amount of In increases. Under normal circumstances, the temperature of growing the n-type semiconductor layer (n-GaN) and the temperature of growing the p-type semiconductor layer (p-GaN) should be the same level of temperature. However, for the above reason, in general, the temperature of growing p-GaN is 100° C. or more lower than the temperature of growing n-GaN. In the present invention, as described above, since the crystallinity of the well layer 15b, which is provided in the light-emitting layer 15 and contains In, has been improved, the decomposition temperature of the InGaN layer has also risen. As a result, it is possible to increase the temperature of growing the p-type semiconductor layer 16.

As practiced in the manufacturing method of the present invention, the difference in the growth temperature between the p-type semiconductor layer 16 and the n-type semiconductor layer 14, is maintained at no more than 60° C., and thereby, it is possible to form the p-type semiconductor layer 16 with superior crystallinity.

In the present invention, with the above configuration, the crystallinity of the topmost p-type semiconductor layer 16 of the LED structure 20 is increased to an extremely high level.

Figure 5:
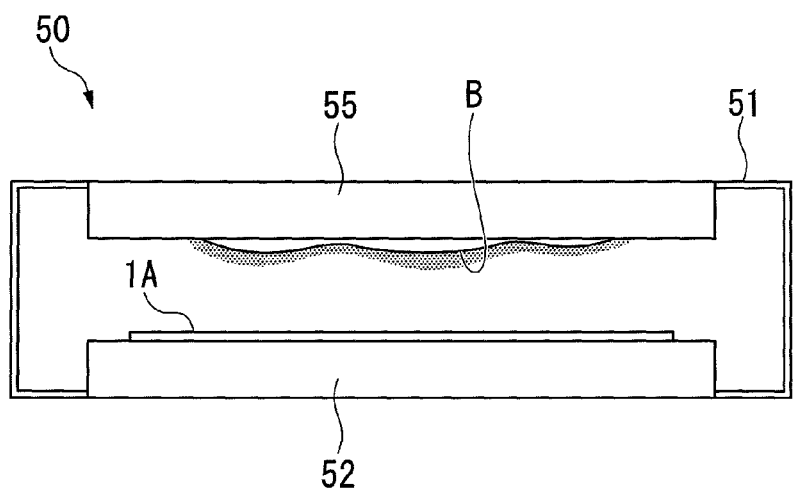
FIG. 5 is a diagram for schematically describing an example of the method for manufacturing the group-III nitride semiconductor light-emitting device according to the present invention, and is a schematic diagram showing an MOCVD apparatus used for forming respective layers which configure an LED structure.

Moreover, when conducting the process of supplying a large amount of only $Cp_2Mg$ in a short period of time before forming the p-type semiconductor layer 16, for example, at the time of forming the p-type semiconductor layer 16 on the light-emitting layer 15 with use of a MOCVD apparatus 50 illustrated in FIG. 5, inside a chamber 51, the preferred distance between a wafer 1A having layers up to the light-emitting layer 15 formed on the substrate 11, and a shield 55 provided parallel with the light-emitting layer 15 side surface of the wafer, is 30 mm or less. While the arrangement of the wafer 1A and the shield 55 provided in the MOCVD apparatus 50 is provided in the above relationship, there is performed the process of supplying a large amount of only $Cp_2Mg$ in a short period of time before forming the p-type semiconductor layer 16, and thereby it is possible to obtain the effect of improvement in the light emission characteristics.

In a group-III nitride semiconductor light-emitting device such as an LED, by applying an electric current into crystals having an energy gap therein, light having energy corresponding to the gap is generated, to thereby obtain a light-emitting effect. Therefore, in order to apply a largest possible amount of electric current, it is necessary to generate holes and carriers of the n-type semiconductor layer and p-type semiconductor layer as much as possible. Here, comparing the n-type semiconductor layer and the p-type semiconductor layer, while the resistance value of n-GaN crystal which constitutes the n-type semiconductor layer is comparatively reduced, reduction in the resistance value of p-GaN crystal which constitutes the p-type semiconductor layer tends to be difficult. For this reason, in order to improve the light emission intensity (brightness) of a light-emitting device, it is preferable that the hole concentration of the p-type semiconductor layer 16 (p-type contact layer 16b) is as high as possible.

As the method for increasing the hole concentration of the p-type semiconductor layer 16 (p-type contact layer 16b), there may be considered a method described below. First, if defect such as Vacancy N, in which N is lost in GaN crystals, is present, Mg is captured by this defect, consequently reducing the activation rate significantly. Therefore, in order to increase the activation rate, it is necessary to improve the crystallinity as much as possible.

Moreover, the crystallinity can be increased when the growth temperature of the p-type semiconductor layer is higher, and accordingly Mg is likely to penetrate into the crystal. However, as In contained in the well layer (GaInN) provided in the light-emitting layer starts to be decomposed, in general, it grows at a temperature of approximately 100° C. lower than that in the case of growing the n-type semiconductor layer (n-GaN) normally. At this time, the decomposition temperature of GaInN is higher when the crystallinity of the AlN seed layer and the n-type semiconductor layer on the lower side of the light-emitting layer are higher, and therefore, it is possible to increase the growth temperature of the n-type semiconductor layer. As for the growth temperature of each layer of this type, in general, the temperature of a carbon tray having SiC coated thereon on which a wafer is to be placed, is measured, and it is difficult to precisely measure the absolute value of the surface temperature of the surface of the substrate (sapphire) or of the GaN crystals which grow thereon. Therefore, in the description of this example, it is described in terms of difference between the temperature at the time of growing the n-type semiconductor layer (n-GaN) and the temperature at the time of growing the p-type semiconductor layer (p-GaN).

In the present invention, by improving the crystallinity of the n-type semiconductor layer 14 which is laminated on the substrate 11 via the AlN seed layer 12, it has become possible to increase the growth temperature of the p-type semiconductor layer 16 by approximately 50° C., compared to the conventional manner. In order to utilize the fact that the growth temperature of the p-type semiconductor layer 14 can be increased by approximately 50° C., for improving the light emission characteristics, it is necessary to change the manufacturing process conditions. In a group-III nitride semiconductor light-emitting device, when growing the p-type semiconductor layer (p-GaN), Mg is doped as a p-type dopant, and in general, a doping treatment is conducted, in general, by supplying biscyclopentadienyl magnesium ($Cp_2Mg$) or bis-ethylcyclopentadienyl magnesium ($EtCp_2Mg$). However, the decomposition condition of this type of dopant material significantly differs from that of TMG and the like, and there is a problem in that its efficiency of being introduced into GaN crystal is low.

Here, it is considered that if a large amount of $Cp_2Mg$ is supplied in a short period of time before growing the p-type contact layer 16b, a large amount of Mg is adsorbed to the surface of the deposition B which is attached on the shield 55 parallel with the substrate 11 (wafer 1A). If the temperature of the substrate 11 (1A) is raised in order to grow the p-type contact layer 16b, the temperature of the shield 55 rises due to radiant heat, and Mg which has been adsorbed on the surface of the deposition B is discharged into the chamber 51. This type of discharged Mg has an effect in which it is more likely to be introduced into the GaN crystal, compared to Mg which was supplied by $Cp_2Mg$. Consequently, the doping treatment described in the present invention is a spike doping treatment in which; a large amount of $CP_2Mg$ is supplied before growing the p-type cladding layer 16a to let the shield 55 (deposition B) adsorb Mg, the temperature is raised at the time of growing the p-type contact layer 16b, Mg is discharged from the deposition B surface into the chamber 51, and this discharged Mg is used as an auxiliary doping source.

That is to say, with use of the wafer 1A having superior crystallinity, by combining the spike doping method described above, it is possible to increase the hole concentration of the p-type semiconductor layer 16 and significantly improve light emission intensity. In this type of spike doping, as shown in FIG. 5, the shield 55 on which the deposition B is attached needs to be arranged immediately above a wafer 1B, and it is particularly important, in view of taking advantage of high crystallinity for improving the light emission characteristics, that the distance from the shield 55, which is provided parallel with the surface of the wafer 1A, is 30 mm or less.

In the present invention, by forming the AlN seed layer 12 having a seed layer function, with AlN single crystals by means of a reactive sputtering method, it is possible to form GaN based semiconductor crystals with an extremely high level of crystallinity thereon. With use of this type of wafer having a reduced amount of defects, it is possible to increase the growth temperature of the p-type semiconductor layer 16, and by supplying a large amount of $Cp_2Mg$ in a short period of time before growing the p-type cladding layer 16a, it is possible to significantly improve the light emission intensity.

Here, even in a case where the crystallinity of the GaN based semiconductor crystals formed on the substrate is high, if there is used a conventional condition for growing an LED structure, significant improvement in the light emission intensity cannot be expected.

Moreover, as conventionally commonly known, if the thickness of the barrier layer provided in the light-emitting layer is made thin, the driving voltage Vf drops and light conversion efficiency rises accordingly. However, if the barrier layer is configured thin, naturally, the occurrence of leakage current becomes more likely. Therefore, in the case where the barrier layer is configured thin and leakage current is to be suppressed, an extremely high level of crystallinity is required.

In the present invention, as described above, when growing an LED structure on GaN crystals with a high level of crystallinity, by optimizing the LED structure and film forming conditions according to the crystallinity of the GaN crystals of the lower layer, it is possible to significantly improve the light emission intensity.

<Formation of Electrodes>

In the manufacturing method of the present embodiment, a positive electrode is formed on the p-type contact layer of the wafer, in which the AlN seed layer 12 and the LED structure 20 are laminated on the substrate 11 with the above respective procedures, and a negative electrode is formed so to come in contact with the n-type contact layer 14b, which constitutes the n-type semiconductor layer 14.

"Formation of Positive Electrode"

First, on the p-type contact layer 16b of the wafer, in which the LED structure 20 is laminated, there is formed a translucent positive electrode 17 composed of ITO, for example.

The method of forming the translucent positive electrode 17 is not particularly limited, and it may be provided with use of a conventional method commonly known in this technical field such as a photolithography method. Moreover, as for the structure thereof, any structure may be used without any particular limitations, including any of the conventionally known structures.

The sputtering method for forming the translucent positive electrode 17 may be conducted under appropriately selected conventionally known conditions, using a conventionally known sputtering apparatus. At this time, first, the substrate in which the LED structure 20 is laminated is housed inside the chamber. The interior of the chamber is preliminarily evacuated until the level of vacuum has become $10^{-4}$ to $10^{-7}$ Pa. Then, having introduced an Ar gas into the chamber and set the pressure therein within a range of 0.1 to 10 Pa, more preferably 0.2 to 5 Pa, electrical discharge is performed. Moreover, the preferred electric power to be supplied at the time of sputtering is in a range of 0.2 to 2.0 kW. At this time, by adjusting the discharge duration and supply electric power, it is possible to control the thickness of the translucent positive electrode to be formed.

Moreover, in some cases, thermal annealing may be conducted with the purpose of alloying or transparentizing after having formed the translucent positive electrode 17, however, it does not always have to be conducted.

Next, on the translucent positive electrode 17 formed on the LED structure 20, there is further formed the positive electrode bonding pad 18.

This positive electrode bonding pad 18 can be formed, for example, by laminating each of materials Ti, Pt, and Au in a sequential manner from the surface side of the translucent positive electrode 17 with use of a conventionally known method.

"Formation of Negative Electrode"

Moreover, when forming the negative electrode 19, first, the light-emitting layer 15, the p-type semiconductor layer 16, and the n-type semiconductor layer 14 formed on the substrate 11 are partially removed by means of photolithography or dry etching, and thereby the exposed region 14d of the n-type contact layer 14b is formed (refer to FIG. 1 and FIG. 2). Having formed a protective film on the entire top surface of the wafer, the protective film on a portion of the exposed region 14d where the negative electrode is to be formed is removed by means of photolithography, and thereby the negative electrode 19 is formed by conventionally known means such as a vacuum deposition method. At this time, for example, by sequentially laminating the respective materials Ti, Pt, and Au from the surface side of the exposed region 14d, it is possible to form the negative electrode 19 in a three-layer structure.

Then, having ground and polished the back surface of the substrate 11 into a mirror surface, the wafer comprising the translucent positive electrode 17, the positive electrode bonding pad 18, and the negative electrode 19 provided on the LED structure 20 as described above, is cut into square shapes having a side length of 350 μm for example, and thereby the light-emitting device chips (light-emitting devices 1) can be formed.

Thus, the light-emitting device 1 illustrated in FIG. 1 and FIG. 2 can be obtained.

According to the manufacturing method of the group-III nitride semiconductor light-emitting device 1 of the present invention described above, it is a method in which the AlN seed layer 12 composed of a group-III nitride based compound is laminated on the substrate 11, and each layer of the n-type semiconductor layer 14, the light-emitting layer 15, and the p-type semiconductor layer 16 respectively formed with a group-III nitride semiconductor are sequentially laminated on the AlN seed layer 12. In this method, in particular, the p-type semiconductor layer 16 is film-formed by means of a MOCVD method, and within the chamber of the film forming apparatus, the distance between the wafer having layers composed of a group-III nitride semiconductor formed on the substrate 11, and the shield which is provided parallel with the wafer's surface composed of the group-III nitride semiconductor, is 30 mm or less. As a result, it is possible to improve the internal quantum efficiency by increasing the crystallinity of each layer composed of the group-III nitride semiconductor, and efficiently manufacture a group-III nitride semiconductor light-emitting device with a high level of light emission output.

[Lamp]

A lamp can be provided in a configuration such that the group-III nitride semiconductor light-emitting device according to the present invention described above is arranged on a lead frame with a casing with use of an adhesive agent, a wire is led out from P, N pads to the lead frame, and electric current is applied from a lead frame terminal.

In general, the configuration is provided in which the group-III nitride semiconductor light emitting device is sealed with a transparent resin for the purpose of protecting the wire, Ag plating on the lead frame surface, and chips.

Furthermore, a phosphor may be dispersed in a sealing resin to thereby configure a white LED.

As described above, the lamp can be configured by means known to one skilled in the art. Techniques for changing the light emission color by combining a light-emitting device and a phosphor are conventionally well known, and these types of techniques may be adopted without any particular restrictions. For example, by appropriate selection of the phosphor, light emission having a longer wavelength than that of the light-emitting device can be achieved. Furthermore, by mixing the emission wavelength of the light-emitting device itself and the wavelength that has been converted by the phosphor, a lamp that emits white light can be obtained. Furthermore, the lamp can be used within all manner of applications, including bullet-shaped lamps for general applications, side view lamps for portable backlight applications, and top view lamps used in display equipment.

Figure 3:
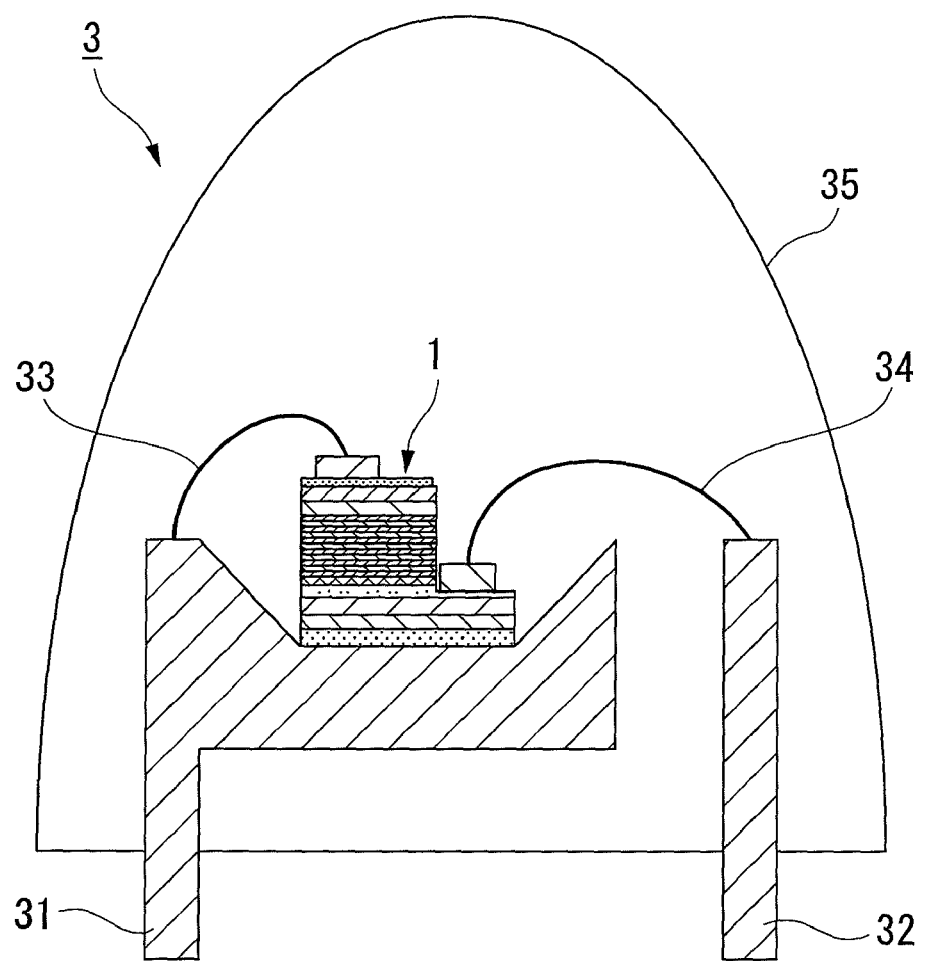
FIG. 3 is a schematic cross-sectional view for schematically showing an example of a lamp configured with use of the group-III nitride semiconductor light-emitting device according to the present invention.

For example, in those cases where the identical surface electrode-type group-III nitride semiconductor light-emitting device 1 is mounted in a bullet-shaped lamp as with the example shown in FIG. 3, the light-emitting device 1 is bonded to one of two frames (frame 31 in FIG. 3), the negative electrode of the light-emitting device 1 (refer to reference symbol 19 shown in FIG. 2) is bonded to a frame 32 using a wire 34, and the positive electrode bonding pad (refer to reference symbol 18 in FIG. 2) of the light-emitting device 1 is bonded to the frame 31 using a wire 33. Further, by encapsulating the periphery of the light-emitting device 1 within a mold 35 formed of a transparent resin, a bullet-shaped lamp 3 shown in FIG. 3 can be manufactured.

[Other Group-III Nitride Semiconductor Light-Emitting Device]

The laminated structure of the group-III nitride semiconductor obtained in the present invention may also be applied, besides the light-emitting devices described above, to photoelectric conversion devices such as laser devices and light-receiving devices, and also to electronic devices such as a HBT and a HEMT.

A multitude of these semiconductor devices with all manner of structures are already known, and the semiconductor device structure such as the LED structure 20 provided in the light-emitting device 1 according to the present invention is not limited in any particular manner, and includes all of these conventional device structures.

EXAMPLES

Next, the group-III nitride semiconductor light-emitting device, the manufacturing method thereof, and the lamp of the present invention are described in detail using examples and comparative examples, although the present invention is in no way limited by these examples.

Experimental Example 1

FIG. 1 shows a cross-sectional schematic view of the laminated semiconductor of the group-III nitride semiconductor light-emitting device manufactured in the present example. In the present experimental example, on the c-plane of a sapphire substrate, there was formed, a layer composed of AlN which serves as an AlN seed layer, and on this, there was formed, by means of an MOCVD method, a layer composed of GaN which serves as a base layer.

<Formation of AlN Seed Layer>

First, there were prepared 100 substrates formed from C-plane sapphire with 100 mm diameter and 0.9 mm thickness, which were all obtained through the same processing steps. This substrate was cut out with OFF angle 0.35°, and the surface thereof was Ra≦2 Å.

Next, this substrate underwent wet cleaning in which the substrate was rotated at 500 rpm and purified water was injected thereat, and then, the substrate rotation speed was increased to 2,000 rpm and a drying treatment was conducted.

Subsequently, the substrate was introduced in a sputtering apparatus, the substrate was heated to 600° C. within the chamber, and a nitrogen gas was introduced at a flow rate of 75 scan. After this, while maintaining the pressure inside the chamber at 1 Pa, high-frequency power of 30 W was applied to the substrate side to generate nitrogen plasma within the chamber, and the substrate surface was cleaned by exposing the substrate to the nitrogen plasma for 15 seconds.

Subsequently, in order to form an AlN seed layer composed of AlN on the substrate, an argon gas and nitrogen gas were introduced into the chamber, and the substrate temperature was set at 600° C. At this time, using high-purity Al with a purity level 5N as a target, the diameter of the target was set to 200 mm, and the target-substrate distance TS was set to 60 mm.

Next, high-frequency power of 1500 W was applied between the target and chamber, and under a condition where 25 sccm of argon gas and 75 sccm of nitrogen gas were supplied (the ratio of nitrogen to the entire gas was 75%) while maintaining the pressure inside the chamber at 0.5 Pa, film formation of AlN on the c-plane of the sapphire substrate was commenced. Further, having applied the high-frequency power for 100 seconds and formed an AlN layer with 30 nm thickness having a single crystalline structure, plasma generation was stopped, and the substrate temperature was lowered.

In the formation of the AlN seed layer, there was used a sputtering apparatus which had a high-frequency type power supply and a mechanism for moving the magnet position within the target. Further, the magnet within the target was rotated at the time of both substrate cleaning and film formation.

Through the above process, the AlN seed layer of AlN single crystals was formed on the substrate composed of c-plane sapphire. A list of conditions for this film formation is shown in Table 1 below.

Moreover, X-ray diffraction was conducted on the AlN seed layer for the sample obtained under the above conditions, and there were measured the full width at half-maximum of the X-ray rocking curve of the (0002) plane and (10-10) plane. The results of this are shown in the Table 4 below.

"Formation of Base Layer"

Next, the substrate with the formed AlN layer was taken out from the sputtering apparatus, and was introduced into a MOCVD apparatus, to form a base layer composed of GaN by the method described below.

First, the substrate was placed on a SiC-coated carbon-made susceptor for heating, which was arranged inside the MOCVD apparatus, and after having supplied a nitrogen gas into the chamber, the heater was operated to raise the substrate temperature to 1,100° C. Then, having confirmed that the temperature was stabilized, supply of ammonia ($NH_3$) serving as a nitrogen source into the chamber was commenced. Subsequently, hydrogen ($H_2$: carrier gas) which contained trimethyl gallium (TMG) vapor serving as a Ga source was supplied into the chamber, and film formation of GaN (base layer) on the substrate (here, on the AlN seed layer) was commenced. Moreover, at this time, the group-V element/group-III element ratio was adjusted to 6,000. Then, the undoped base layer composed of GaN with 6 μm thickness was formed at a growth rate of 2 μm/hr.

"Formation of n-Type Contact Layer"

Following the formation of the base layer, there was formed an n-type contact layer composed of GaN, using the same MOCVD apparatus. At this time, the n-type contact layer was doped with Si. With the exception that monosilane ($SiH_4$) was supplied at 120 sccm as a Si dopant raw material, crystal growth was conducted under the same conditions as those of the base layer. Moreover, monosilane was supplied into the chamber along with the carrier gas, and the supply concentration thereof was controlled using its ratio to the amount of TMG supply. Then, supply of the raw material into the MOCVD apparatus was stopped to stop crystal growth, and then, power distribution to the heater was stopped to thereby lower the substrate temperature to room temperature. When taken out from the apparatus, the substrate exhibited a colorless, transparent, and mirror-like aspect.

The base layer composed of undoped GaN was formed on the AlN seed layer and the n-type contact layer was further formed on the base layer through the above procedure. A list of film formation conditions at this time is shown in Table 2.

Moreover, X-ray diffraction was conducted on the n-type contact layer composed of n-GaN semiconductor crystals for the sample obtained under the above conditions, and there were measured the full width at half-maximum of the X-ray rocking curve of the (0002) plane and (10-10) plane. The results of this are shown in the Table 4 below.

"Formation of n-Type Cladding Layer-Light-Emitting Layer-p-Type Semiconductor Layer"

(Formation of N-Type Cladding Layer)

As for the substrate having the n-type contact layer grown in the above procedure, the substrate temperature was lowered to 760° C. using nitrogen serving as a carrier gas, while ammonia was being supplied into the MOCVD apparatus.

Subsequently, a $SiH_4$ gas and vapors of TMI and TEG generated by bubbling were supplied into the chamber while the supply of ammonia into the chamber was continued, to thereby form an n-type cladding layer composed of $Ga_{0.99}In_{0.01}N$ and having a film thickness of 50 nm.

(Formation of Light-Emitting Layer)

The light-emitting layer was configured with a barrier layer composed of GaN and a well layer composed of $Ga_{0.92}In_{0.08}N$, and had a multiple quantum well structure. In order to form this light-emitting layer, the barrier layer was first formed on the n-type cladding layer, and the barrier layer (film thickness 3 nm) composed of $Ga_{0.92}In_{0.08}N$ was formed on this barrier layer. In the present example, this type of lamination procedure was repeated five times, and a sixth barrier layer was then formed on top of the fifth laminated well layer, thereby forming a structure in which a barrier layer was positioned at both sides of the light-emitting layer having a multiple quantum well structure.

First, the substrate temperature was raised to 940° C. and the supply of TEG and $SiH_4$ into the chamber was commenced, to thereby form a barrier layer with a thickness of 6 nm composed of GaN which was doped with Si for a predetermined period of time. The amount of $SiH_4$ at this time was adjusted so that the Si concentration was $1\times10^{17}$ $cm^{-3}$.

After the completion of the growth of the barrier layer, the substrate temperature was lowered to 760° C., then TEG and TIG were supplied into the chamber to conduct a process of forming a well layer, and thereby a $Ga_{0.92}In_{0.08}N$ layer (well layer) with 3 nm film thickness was formed.

Having completed the growth of the well layer composed of $Ga_{0.92}In_{0.08}N$, the setting of the TEG supply amount was changed. Subsequently, the supply of TEG and $SiH_4$ was resumed, to thereby form a second barrier layer.

The procedure described above was repeated five times, and thereby five Si-doped barrier layers composed of GaN and the five well layers composed of $Ga_{0.92}In_{0.08}N$ were formed.

Following the completion of the formation of the fifth well layer composed of $Ga_{0.92}In_{0.08}N$, the sixth barrier layer was formed under the conditions similar to that described above.

Through the above procedure, there was formed the light-emitting layer in a multiple quantum well structure, which was configured with six barrier layers composed of GaN and five well layers composed of $Ga_{0.92}In_{0.08}N$.

"Formation of p-Type Semiconductor Layer"

Following the respective processes described above, with use of the same MOCVD apparatus, a Mg-doped p-type cladding layer composed of $Al_{0.07}Ga_{0.93}N$ was formed with a film thickness of 20 nm, and further, a Mg-doped p-type contact layer composed of GaN was formed with a film thickness of 150 nm thereon, to thereby provide a p-type semiconductor layer.

First, the substrate temperature was raised from 940° C. to 1,010° C. while the supply of $NH_3$ gas was continued, then the carrier gas was switched from nitrogen to hydrogen, and $Cp_2Mg$ was supplied into the chamber for 15 seconds at 700 sccm, to be adsorbed on the deposition which was attached to the shield arranged parallel with the wafer's lamination surface inside the chamber. Further, a predetermined amount of TMG and $Cp_2Mg$ were supplied into the chamber, to thereby form an Mg-doped p-type cladding layer composed of $Al_{0.07}Ga_{0.93}N$.

Then, the flow rate of $Cp_2Mg$ was changed, and a p-type contact layer 16b with 150 nm thickness composed of p-type GaN was formed.

Having completed the vapor phase epitaxially of the p-type cladding layer and the p-type contact layer, the supply of MO gas was stopped, and the substrate inside the chamber was cooled at a predetermined cooling rate.

The epitaxial wafer for an LED manufactured as described above has a structure such that having formed an AlN layer (AlN seed layer), in which a grain boundary is completely absent, on a sapphire substrate having a c-plane, there are sequentially laminated, from the substrate side: a 6 μm undoped GaN layer (base layer); a 2 μm Si-doped n-type contact layer composed of GaN and having an electron concentration of $5\times10^{18}$ $cm^{-3}$; a 50 nm n-type cladding layer composed of $Ga_{0.99}In_{0.01}N$ and having a Si concentration of $4\times10^{18}$ $cm^{-3}$; a multiple quantum well structure (light-emitting layer) which starts with a GaN barrier layer and ends with a GaN barrier layer, and is provided with five Si-doped GaN barrier layers (barrier layers) with a layer thickness of 6 nm, and five undoped $Ga_{0.92}In_{0.08}N$ well layers with a layer thickness of 3 nm; and a p-type semiconductor layer which is configured with a Mg-doped p-type cladding layer composed of $Al_{0.07}Ga_{0.93}N$ with a film thickness of 20 nm, and a Mg-doped p-type contact layer b composed of GaN with a film thickness of 150 nm.

"Manufacturing of LED"

Next, an LED was manufactured, using the epitaxial wafer for an LED obtained in the above method.

First, on the surface of the p-type contact layer of the above wafer, there was formed, by means of a commonly known photolithography technique and etching technique, a translucent positive electrode composed of ITO. At this time, first, the wafer was introduced into a sputtering apparatus, and ITO with an approximately 2 nm film thickness was film-formed on the p-type contact layer by means of an RF sputtering method. Next, ITO with an approximately 400 nm film thickness was laminated by means of a DC sputtering method. The pressure at the time of conducting the RF sputtering film formation was approximately 0.3 Pa, and the supply electric power was 0.5 kW. Moreover, the pressure at the time of conducting the DC sputtering film formation was approximately 0.8 Pa, and the supply electric power was 1.5 kW.

Having formed an ITO film in the above procedure, an annealing treatment was conducted for one minute at temperature of 500° C. within a nitrogen atmosphere containing 20% of oxygen.

Having completed the annealing treatment, a general dry etching was conducted on a region where a negative electrode was to be formed, and the surface of the n-type contact layer was exposed only within this region (refer to FIG. 1 and FIG. 2). Subsequently, having formed a protective film composed of $SiO_2$ on the entire wafer surface, the protective film on the surface of the pad (each electrode) was removed by means of a photolithography technique. Further, in a part of the ITO film and in the exposed region of the n-type contact layer, there were sequentially laminated, by means of a vacuum deposition method, a first layer (film thickness=40 nm) composed of Ti, a second layer (film thickness=200 nm) composed of Pt, and a third layer (film thickness=300 nm) composed of Au, to thereby form them as a positive electrode bonding pad and a negative electrode respectively.

As for the wafer which had been made into a device in the procedure described above, the back side of the substrate composed of sapphire was ground and polished using abrasive grains of diamond fine particles, to finally provide it in a mirror finished state. The wafer was then cut into square chips having a side length of 350 μm, and separated into individual LED chips each having a square shape with a side length of 350 μm illustrated in FIG. 1 and FIG. 2.

Subsequently, the LED chip was bonded on the lead frame for 3528 top-view packaging, using an epoxy adhesive agent, the negative electrode bonding pad and the positive electrode bonding pad were respectively connected to the lead frame using a gold wire (Au), and sealed with an epoxy resin sealant (refer to lamp 3 in FIG. 3).

In the top view packaging prepared in the manner described above, a forward current was caused to flow between the positive electrode (p-side) and the negative electrode (n-side) to evaluate the electrical characteristics and light emission characteristics. A list of these results is shown in Table 4 below.

With the sample manufactured in the present experimental example, the forward voltage at a current of 20 mA was 3.05 V. Further, when the state of light emission was observed through the p-side translucent electrode, the light emission wavelength was 459 nm and the light emission output was 22.3 mW.

Moreover, in the present experimental example, approximately 50,000 pieces of LEDs, excluding ones with defective appearance, were obtained from a wafer with a diameter 100 mm, and the above electrical characteristics and light emission characteristics were obtained without inconsistency from LED chips prepared from the substantially entire wafer surface.

The cleaning processes of the substrate and the film formation conditions of the AlN seed layer are shown in Table 1 below, the film formation conditions of the base layer and the n-type contact layer are shown in Table 2 below, and the film formation conditions of the n-type cladding layer, the light-emitting layer, and the p-type cladding layer are shown in Table 3 below. Moreover, a list of measurement results of the electrical characteristics and the light emission characteristics, and a list of measurement results of the full width at half-maximum (FWHM) of the X-ray rocking curve of the AlN seed layer and the p-type semiconductor layer (p-type contact layer) are shown in Table 4 below.

TABLE 1

| Experimental example number | Condition item | Substrate surface plasma treatment | Buffer layer (AlN) growth conditions | Remarks |
|---|---|---|---|---|
| 1-11 | Heater temperature | 600° C. | 600° C. | Standard |
|  | Ar flow rate | 0 sccm | 25 sccm |  |
|  | N2 flow rate | 75 sccm | 75 sccm |  |
|  | Application power | 30 W | 1500 W |  |
|  | Total gas pressure | 1.0 Pa | 0.5 Pa |  |
|  | Base pressure | 4 × 10−6 Pa | 4 × 10−6 Pa |  |
|  | TS distance | 60 mm | 60 mm |  |
|  | Application time | 15 seconds | 100 seconds |  |
| 12 | Heater temperature | 600° C. | 600° C. | Film formation time |
|  | Ar flow rate | 0 sccm | 25 sccm | short |
|  | N2 flow rate | 75 sccm | 75 sccm |  |
|  | Application power | 30 W | 1500 W |  |
|  | Total gas pressure | 1.0 Pa | 0.5 Pa |  |
|  | Base pressure | 4 × 10−6 Pa | 4 × 10−6 Pa |  |
|  | TS distance | 60 mm | 60 mm |  |
|  | Application time | 15 seconds | 60 seconds |  |
| 13 | Heater temperature | 600° C. | 600° C. | Film formation time a |
|  | Ar flow rate | 0 sccm | 25 sccm | little longer, upper limit |
|  | N2 flow rate | 75 sccm | 75 sccm |  |
|  | Application power | 30 W | 1500 W |  |
|  | Total gas pressure | 1.0 Pa | 0.5 Pa |  |
|  | Base pressure | 4 × 10−6 Pa | 4 × 10−6 Pa |  |
|  | TS distance | 60 mm | 60 mm |  |
|  | Application time | 15 seconds | 150 seconds |  |
| 14 | Heater temperature | 600° C. | 600° C. | Film formation time |
|  | Ar flow rate | 0 sccm | 25 sccm | long |
|  | N2 flow rate | 75 sccm | 75 sccm |  |
|  | Application power | 30 W | 1500 W |  |
|  | Total gas pressure | 1.0 Pa | 0.5 Pa |  |
|  | Base pressure | 4 × 10−6 Pa | 4 × 10−6 Pa |  |
|  | TS distance | 60 mm | 60 mm |  |
|  | Application time | 15 seconds | 200 seconds |  |

TABLE 1-continued

| Experimental example number | Condition item | Substrate surface plasma treatment | | Buffer layer (AlN) growth conditions | | Remarks |
|---|---|---|---|---|---|---|
| 15 | Heater temperature | 600° | C. | 600° | C. | Film formation time a lot longer |
| | Ar flow rate | 0 | sccm | 25 | sccm | |
| | N2 flow rate | 75 | sccm | 75 | sccm | |
| | Application power | 30 | W | 1500 | W | |
| | Total gas pressure | 1.0 | Pa | 0.5 | Pa | |
| | Base pressure | 4 × 10−6 | Pa | 4 × 10−6 | Pa | |
| | TS distance | 60 | mm | 60 | mm | |
| | Application time | 15 | seconds | 300 | seconds | |

TABLE 2

| Condition item | Base layer (GaN) growth condition | | n-type contact layer (n-GaN) growth condition | |
|---|---|---|---|---|
| Total gas pressure | 400 | mbar | 400 | mbar |
| Susceptor temperature | 1,100° | C. | 1,100° | C. |
| H2 flow rate | 30 | slm | 30 | slm |
| N2 flow rate | 0 | slm | 0 | slm |
| TMG flow rate | 300 | sccm | 300 | sccm |
| NH3 flow rate | 18 | slm | 18 | slm |
| SiH4 flow rate | 0 | | 120 | sccm |
| GaN growth rate | 2 | μm/hr | | |
| GaN thickness | 6 | μm | | |
| n-GaN thickness | | | 2 | μm |

TABLE 3

| Growth condition | n-type semiconductor layer | Light-emitting layer (MQW) (well layer/barrier layer) | p-type semiconductor layer | |
|---|---|---|---|---|
| | | | p-type cladding layer | p-type contact layer |
| Total gas pressure | 400 mbar | 400 mbar | 400 mbar | 400 mbar |
| Susceptor temperature | 1040° C. | 760/940° C. | 1,010° C. | 1,010° C. |
| N2 flow rate | 50 slm | 50 slm | 0 slm | 0 slm |
| H2 flow rate | 0 slm | 0 slm | 30 slm | 30 slm |
| TMG flow rate | 0 sccm | 0 sccm | 180 sccm | 180 sccm |
| TEG flow rate | 250 sccm | 150 sccm | 0 sccm | 0 sccm |
| NH3 flow rate | 18 sccm | 18 sccm | 21 sccm | 21 sccm |
| TIG flow rate | 0 sccm | 120/0 sccm | 0 sccm | 0 sccm |
| SiH4 flow rate | 50 sccm | 0/30 sccm | 0 sccm | 0 sccm |
| Cp2Mg flow rate | 0 sccm | 0 sccm | 130 sccm | 260 sccm |

TABLE 4

| Experimental example number | Film formation special note | Forward voltage If (mA) | Driving voltage Vf | | Leakage current (IR) (20 V) (μA) | VR (10 μA) (V: upper limit 20) | Light emission output Po (mW) | Light emission wavelength λd (nm) | Buffer layer (AlN) | | p-type semiconductor layer (p-type contact layer) | |
|---|---|---|---|---|---|---|---|---|---|---|---|---|
| | | | If = 1 μA (V) | If = 20 mA (V) | | | | | FWHM (0002) (arcsec) | FWHM (10-10) (deg) | FWHM (0002) (arcsec) | FWHM (10-10) (arcsec) |
| 1 | Barrier layer thickness 6 nm | 20 | 2.33 | 3.05 | 0.05 | 20 | 22.3 | 459 | 36 | 1.4 | 41 | 233 |
| 2 | Barrier layer thickness 7 nm | 20 | 2.34 | 3.03 | 0.05 | 20 | 22.1 | 461 | 35 | 1.5 | 42 | 236 |

TABLE 4-continued

| Experimental example number | Film formation special note | Forward voltage If (mA) | Driving voltage Vf If = 1 μA (V) | Driving voltage Vf If = 20 mA (V) | Leakage current (IR) (20 V) (μA) | VR (10 μA) (V: upper limit 20) | Light emission output Po (mW) | Light emission wavelength λd (nm) | Buffer layer (AlN) FWHM (0002) (arcsec) | Buffer layer (AlN) FWHM (10-10) (deg) | p-type semiconductor layer (p-type contact layer) FWHM (0002) (arcsec) | p-type semiconductor layer (p-type contact layer) FWHM (10-10) (arcsec) |
|---|---|---|---|---|---|---|---|---|---|---|---|---|
| 3 | Barrier layer thickness 8 nm | 20 | 2.33 | 2.98 | 0.06 | 20 | 21.9 | 463 | 36 | 1.4 | 39 | 246 |
| 4 | Barrier layer thickness 9 nm | 20 | 2.34 | 3.03 | 0.05 | 20 | 21.6 | 466 | 37 | 1.5 | 43 | 245 |
| 5 | Barrier layer thickness 4 nm | 20 | 1.86 | 2.86 | 16.60 | 17 | 6.2 | 451 | 31 | 1.4 | 45 | 215 |
| 6 | Barrier layer thickness 5 nm | 20 | 2.15 | 3.01 | 1.36 | 19 | 15.2 | 455 | 34 | 1.4 | 38 | 216 |
| 7 | Barrier layer thickness 10 nm | 20 | 2.33 | 3.08 | 0.07 | 20 | 21.0 | 468 | 35 | 1.5 | 46 | 245 |
| 8 | Barrier layer thickness 12 nm | 20 | 2.33 | 3.14 | 0.07 | 20 | 20.3 | 471 | 38 | 1.4 | 52 | 249 |
| 9 | Barrier layer thickness 14 nm | 20 | 2.34 | 3.25 | 0.08 | 20 | 20.1 | 476 | 38 | 1.5 | 55 | 246 |
| 10 | Barrier layer thickness 16 nm | 20 | 2.34 | 3.36 | 0.07 | 20 | 18.5 | 478 | 36 | 1.5 | 61 | 247 |
| 11 | No Mg attachment process | 20 | 2.32 | 3.03 | 0.16 | 20 | 18.3 | 459 | 45 | 1.5 | 52 | 239 |
| 12 | Film formation time short | 20 | 2.24 | 3.01 | 5.93 | 18 | 20.4 | 459 | 35 | 1.4 | 211 | 350 |
| 13 | Film formation time a little longer upper limit | 20 | 2.34 | 3.02 | 0.06 | 20 | 21.8 | 460 | 42 | 1.6 | 50 | 249 |
| 14 | Film formation time long | 20 | 2.29 | 3.01 | 0.08 | 20 | 17.5 | 461 | 43 | 1.8 | 55 | 290 |
| 15 | Film formation time a lot longer | 20 | 2.25 | 3.01 | 0.25 | 20 | 15.3 | 462 | 46 | 2.1 | 57 | 350 |

Experimental Examples 2 to 11

With the exception that at the time of forming the light-emitting layer, the thickness of the barrier layer was respectively changed to the thickness shown in Table 4 by changing the time for growing the barrier layer which constitutes a multiple quantum well structure, LED chip samples of Experimental Examples 2 to 11 were manufactured in a procedure similar to that of Experimental Example 1 above. As with Experimental Example 1, a list of measurement results of the electrical characteristics and light emission characteristics, and a list of measurement results of FWHM of the AlN seed layer and the p-type semiconductor layer are shown in Table 4.

Experimental Examples 12 to 15

The conditions of substrate cleaning and the film formation conditions of AlN were set as shown in Table 1, in a procedure similar to that of Experimental Example 1 above, an AlN seed layer was laminated on a substrate, and respective layers were laminated thereon, to thereby manufacture LED chip samples of Experimental Examples 12 to 15. As with Experimental Example 1, a list of measurement results of the electrical characteristics and light emission characteristics, and a list of measurement results of FWHM of the AlN seed layer and the p-type semiconductor layer are shown in Table 3.

[Evaluation Results of Respective Experimental Examples]

As shown in Table 4, it can be understood that the samples of Experimental Examples 1 to 4, in which the total film thickness of the thickness of the single barrier layer constituting the light-emitting layer, and the thickness of the adjacent well layer, was in an appropriate range, had a high level of crystallinity in the p-type semiconductor layer, and had superior electrical characteristics and light emission characteristics.

On the other hand, as shown in the section of "Special note on film formation condition" in Table 4, the samples of Experimental Examples 5 to 12, 14, and 15 manufactured under the conditions and in the methods which were not necessarily in an appropriate range, resulted in at least one inferior item among the respective items, namely: crystallinity of the p-type semiconductor layer; electrical characteristics; and light emission characteristics.

From the results of the above examples, it is clear that the group-III nitride semiconductor light-emitting device of the present invention has a high level of crystallinity, superior internal quantum efficiency, and a superior light emission characteristic.

INDUSTRIAL APPLICABILITY

A group-III nitride semiconductor light-emitting device obtained in the present invention is composed of group-III nitride semiconductors having superior crystallinity, and it has a superior light emission characteristic. Therefore, it is possible to manufacture a light-emitting diode or a laser diode with superior light emission characteristics, or a semiconductor device for electronic devices.

| [Description of the Reference Symbols] | |
|---|---|
| 1 | Group-III nitride semiconductor light-emitting device (light-emitting device) |
| 1A | Wafer |
| 3 | Lamp |
| 11 | Substrate |
| 12 | AlN seed layer |
| 14 | n-type semiconductor layer |
| 15 | Light-emitting layer |
| 15a | Barrier layer |
| 15b | Well layer |
| 16 | p-type semiconductor layer |
| 20 | LED structure |
| 40 | Sputtering apparatus |
| 50 | MOCVD apparatus (film forming apparatus) |
| 55 | Shield |

The invention claimed is:

1. A group-III nitride semiconductor light-emitting device in which an AlN seed layer is laminated on a substrate, and on this AlN seed layer, there are sequentially laminated each layer of an n-type semiconductor layer, a light-emitting layer, and a p-type semiconductor layer respectively composed of a group-III nitride semiconductor, wherein
the full width at half-maximum of the X-ray rocking curve of the (0002) plane of said p-type semiconductor layer is 60 arcsec or less, and the full width at half-maximum of the X-ray rocking curve of the (10-10) plane is 250 arcsec or less.

2. A group-III nitride semiconductor light-emitting device according to claim 1, wherein said light-emitting layer is configured such that a barrier layer and a well layer are alternately and repeatedly laminated, and are laminated in such an order that said barrier layer is arranged on said n-type semiconductor layer side and on said p-type semiconductor layer side, and the single-layer thickness of said barrier layer is within a range of 6 to 9 nm.

3. A group-III nitride semiconductor light-emitting device according to claim 2, wherein said light-emitting layer is further configured in a way such that the total thickness of a single layer of said barrier layer and a single layer of said well layer adjacent to this single layer of barrier layer is within a range of 8 to 12 nm.

4. A group-III nitride semiconductor light-emitting device according to claim 1, wherein said AlN seed layer is composed of AlN single crystals.

5. A group-III nitride semiconductor light-emitting device according to claim 1, wherein the full width at half-maximum of the X-ray rocking curve in the (0002) plane of said AlN seed layer is 100 arcsec or less, and the full width at half-maximum of the X-ray rocking curve in the (10-10) plane is 1.7° or less.

6. A method for manufacturing a group-III nitride semiconductor light-emitting device according to claim 1, wherein
said p-type semiconductor layer is formed by means of a metal-organic chemical vapor deposition method (MOCVD method), and within a chamber of a film forming apparatus, the distance between a wafer with a layer composed of a group-III nitride semiconductor formed on said substrate, and
a shield provided parallel with this wafer's surface composed of the group-III nitride semiconductor, is 30 mm or less.

7. A group-III nitride semiconductor light-emitting device which can be obtained, using the manufacturing method according to claim 6.

8. A lamp which uses a group-III nitride semiconductor light-emitting device according to claim 1.

* * * * *